(12) United States Patent
Chien et al.

(10) Patent No.: US 8,717,079 B2
(45) Date of Patent: May 6, 2014

(54) FLIP-FLOP FOR LOW SWING CLOCK SIGNAL

(71) Applicant: MediaTek Inc., Hsin-Chu (TW)

(72) Inventors: Cheng-Hsing Chien, Hsinchu (TW); Yung-Chieh Yu, Chu-Pei (TW); Jia-Yi Xu, PuDong (CN)

(73) Assignee: Mediatek Inc., Hsin-Chu (TW)

( * ) Notice: Subject to any disclaimer, the term of this patent is extended or adjusted under 35 U.S.C. 154(b) by 0 days.

(21) Appl. No.: 13/908,700

(22) Filed: Jun. 3, 2013

(65) Prior Publication Data

US 2013/0278314 A1   Oct. 24, 2013

Related U.S. Application Data

(62) Division of application No. 13/048,548, filed on Mar. 15, 2011, now Pat. No. 8,471,618.

(60) Provisional application No. 61/322,967, filed on Apr. 12, 2010.

(51) Int. Cl.
*H03K 3/356* (2006.01)
*H03K 3/00* (2006.01)

(52) U.S. Cl.
USPC .......................... 327/208; 327/203; 327/212

(58) Field of Classification Search
USPC .......... 327/218, 201–203, 206, 208, 212, 214
See application file for complete search history.

(56) References Cited

U.S. PATENT DOCUMENTS

| 5,789,956 | A | 8/1998 | Mahant-Shetti et al. |
| 5,811,992 | A | 9/1998 | D'Souza |
| 5,850,157 | A | 12/1998 | Zhu et al. |
| 6,614,276 | B2 * | 9/2003 | Robertson et al. ............ 327/211 |
| 6,642,765 | B2 | 11/2003 | Markovic et al. |
| 6,657,474 | B2 | 12/2003 | Varadarajan |
| 6,677,795 | B2 | 1/2004 | Itoh |
| 6,703,881 | B2 | 3/2004 | Lu |
| 6,768,365 | B2 | 7/2004 | Curran et al. |
| 6,794,914 | B2 | 9/2004 | Sani et al. |
| 6,879,185 | B2 | 4/2005 | Swami et al. |

(Continued)

FOREIGN PATENT DOCUMENTS

CN           1967645           5/2007

OTHER PUBLICATIONS

English language translation of abstract of CN 1967645 (published May 23, 2007).

*Primary Examiner* — Hai L Nguyen
(74) *Attorney, Agent, or Firm* — McClure, Qualey & Rodack, LLP

(57) ABSTRACT

The invention provides a flip-flop. In one embodiment, the flip-flop receives a low swing clock signal, and comprises a first NMOS transistor, a first latch circuit, a second NMOS transistor, and a second latch circuit. The low swing clock signal is inverted to obtain an inverted low swing clock signal. The first NMOS transistor is coupled between a receiving node and a first node, and has a gate coupled to the inverted low swing clock signal. The first latch circuit is coupled between the first node and a second node. The second NMOS transistor is coupled between the second node and a third node. The second latch circuit is coupled between the third node and a fourth node, and generates an output signal on the fourth node.

8 Claims, 15 Drawing Sheets

(56) References Cited

U.S. PATENT DOCUMENTS

| | | |
|---|---|---|
| 6,970,018 B2 | 11/2005 | Markovic et al. |
| 7,248,090 B2 | 7/2007 | Ramprasad |
| 7,292,672 B2 | 11/2007 | Isono |
| 7,868,677 B2 | 1/2011 | Jain |
| 8,209,573 B2 | 6/2012 | Brown et al. |
| 8,471,618 B2 * | 6/2013 | Chien et al. ............... 327/208 |
| 2002/0017937 A1 | 2/2002 | Schoellkopf |
| 2003/0117933 A1 | 6/2003 | Hsu et al. |
| 2003/0160646 A1 | 8/2003 | Varadarajan |
| 2004/0051575 A1 | 3/2004 | Machida |
| 2004/0095175 A1 | 5/2004 | Chalasani |
| 2004/0169544 A1 | 9/2004 | Roy et al. |
| 2007/0176642 A1 | 8/2007 | Kursun et al. |
| 2008/0218234 A1 | 9/2008 | Jain |
| 2009/0284288 A1 | 11/2009 | Zhang et al. |

* cited by examiner

(12)  United States Patent

FLIP-FLOP FOR LOW SWING CLOCK SIGNAL

CROSS REFERENCE TO RELATED APPLICATIONS

This application is a Divisional of pending U.S. patent application Ser. No. 13/048,548, filed Mar. 15, 2011, and entitled "Flip-Flop for Low Swing Clock Signal" which claims the benefit of U.S. Provisional Application No. 61/322,967, filed on Apr. 12, 2010, the entirety of which is incorporated by reference herein.

BACKGROUND OF THE INVENTION

1. Field of the Invention

The invention relates to flip-flops, and more particularly to flip-flops receiving low swing clock signals.

2. Description of the Related Art

A flip-flop is a circuit that has two stable states and can be used to store state information. The two stable states of a flip-flop respectively represent values "0" and "1". A flip-flop is usually controlled by a clock signal. Clocking causes the flip-flop to either change or retain its output signal based upon the values of input signals at a transition. Some flip-flops change output on a rising edge of the clock signal, others on the falling edge of the clock signal.

Referring to FIG. 1, a circuit diagram of a conventional flip-flop 200 is shown. A conventional flip-flop 200 may include inverters 231, 232, 233, and 234, passing gate circuits 202 and 206, and latch circuits 204 and 208. A high swing clock signal CK is fed to an inverter 251. The inverter 251 inverts the high swing clock signal CK to generate an inverted clock signal CKB, and an inverter 253 then inverts the inverted clock signal CKB to generate a clock signal CK1.

The latch circuit 204 includes two inverters 213 and 214 and a transmission gate including PMOS transistor 215 and an NMOS transistor 216. The latch circuit 208 includes two inverters 223 and 224 and a transmission gate including a PMOS transistor 225 and an NMOS transistor 226. The inverter 231 inverts a data signal to generate an inverted data signal. When the clock signal CK1 is at a logic low level and the inverted clock signal CKB is at a logic high level, the passing gate circuit 202 passes the inverted data signal to a node 217 of the latch circuit 204, the transmission gate including transistors 215 and 216 cuts off the feedback path of the latch circuit 204, the passing gate circuit 206 is off, and the transmission gate including transistors 225 and 226 retains/builds the feedback path of the latch circuit 208. Then the latch circuit 204 receives the inverted data signal from the node 217, and inverts the inverted data signal to generate a data signal on a node 218. When the inverted clock signal CKB is at a logic low level and the clock signal CK1 is at a logic high level, the passing gate circuit 202 is off, the transmission gate including transistors 215 and 216 retains/builds the feedback path of the latch circuit 204 the passing gate circuit 206 passes the data signal from the node 218 to a node 227 of the latch circuit 208, and the transmission gate including transistors 225 and 226 cuts off the feedback path of the latch circuit 208. The latch circuit 208 receives the data signal from the node 227, and inverts the data signal to generate an inverted data signal on a node 228. The inverter 232 then inverts the inverted data signal to generate a data signal on an output node Q, and the inverters 233 and 234 deliver the inverted data signal to an inverted output node QB.

Oscillation of a clock signal induces power consumption. If a clock signal of a circuit oscillates with a low swing voltage, the power consumption of the circuit is reduced by a great level. Because portable devices have a limited amount of power resources, power consumption reduction is important for portable devices. The clock signals used in circuits with limited power resources therefore are designed to have a low swing level for power consumption reduction. The conventional flip-flop 200, however, cannot directly receive a low swing clock signal. The passing gate circuits 202 and 206 respectively include PMOS transistors 211 and 221 having gates coupled to clock signals CK1 and CKB, and the latch circuits 204 and 208 also include PMOS transistors 215 and 225 having gates coupled to clock signals CKB and CK1. If the clock signals CK1 and CKB are low swing clock signals, the PMOS transistors 211, 215, 221, and 225 cannot be completely turned off by the low voltage of the clock signals. The conventional flip-flop 200 therefore cannot normally operate with a low swing clock signal. The voltage level of the low swing clock signals therefore must be amplified with low-to-high level shifters before the low swing clock signals are fed to conventional flip-flops. The level shifters increase manufacturing cost of a circuit. If new flip-flops capable of receiving a low swing clock signal are used in the circuit, the low-to-high level shifters can be omitted to reduce the manufacturing cost of the circuit. Thus, new flip-flops capable of receiving low swing clock signals are required.

BRIEF SUMMARY OF THE INVENTION

The invention provides a flip-flop. In one embodiment, the flip-flop receives a low swing clock signal, and comprises a first NMOS transistor, a first latch circuit, a second NMOS transistor, and a second latch circuit. The low swing clock signal is inverted to obtain an inverted low swing clock signal. The first NMOS transistor is coupled between a receiving node and a first node, has a gate coupled to the inverted low swing clock signal, and is capable of passing a data signal from the receiving node to the first node when the inverted low swing clock signal is at a logic high level. The first latch circuit is coupled between the first node and a second node, and is capable of inverting the data signal to generate an inverted data signal on the second node. The second NMOS transistor is coupled between the second node and a third node, has a gate coupled to the inverted low swing clock signal, and is capable of passing the inverted data signal from the second node to the third node when the low swing clock signal is at the logic high level. The second latch circuit is coupled between the third node and a fourth node, and is capable of inverting the inverted data signal to generate an output signal on the fourth node.

The invention further provides a flip-flop. In one embodiment, the flip-flop receives a low swing clock signal, and comprises a first NMOS transistor, a first latch circuit, a second NMOS transistor, and a second latch circuit. The low swing clock signal is inverted to obtain an inverted low swing clock signal. The first NMOS transistor is coupled between a receiving node and a first node, has a gate coupled to the inverted low swing clock signal, and is capable of passing a data signal from the receiving node to the first node when the inverted low swing clock signal is at a logic high level. The first latch circuit is coupled between the first node and a second node, and is capable of inverting the data signal to generate a processed data signal on the second node when a reset bar signal is at the logic high level. The second NMOS transistor is coupled between the second node and a third node, has a gate coupled to the low swing clock signal, and is capable of passing the processed data signal from the second node to the third node when the low swing clock signal is at the logic high level. The second latch circuit is coupled between the third node and a fourth node, and is capable of inverting the processed data signal to generate an output signal on the fourth node when a reset bar signal is at a logic high level and generating a logic high voltage as the output signal on the fourth node when the reset bar signal is at a logic low level.

The invention further provides a flip-flop. In one embodiment, the flip-flop receives a low swing clock signal, and comprises a first NMOS transistor, a first latch circuit, a second NMOS transistor, and a second latch circuit. The low swing clock signal is inverted to obtain an inverted low swing clock signal. The first NMOS transistor is coupled between a receiving node and a first node, has a gate coupled to the inverted low swing clock signal, and is capable of passing a data signal from the receiving node to the first node when the inverted low swing clock signal is at a logic high level. The first latch circuit is coupled between the first node and a second node, and is capable of inverting the data signal to generate a processed data signal on the second node when a set bar signal is at the logic high level, and generating a logic high voltage as the processed data signal on the second node when the set bar signal is at a logic low level. The second NMOS transistor is coupled between the second node and a third node, has a gate coupled to the low swing clock signal, and is capable of passing the processed data signal from the second node to the third node when the low swing clock signal is at the logic high level. The second latch circuit is coupled between the third node and a fourth node, and is capable of generating a logic low voltage as an output signal on the fourth node when the set bar signal is at the logic low level.

The invention further provides a flip-flop. In one embodiment, the flip-flop receives a low swing clock signal, and comprises a first NMOS transistor, a first latch circuit, a second NMOS transistor, and a second latch circuit. The low swing clock signal is inverted to obtain an inverted low swing clock signal. The first NMOS transistor is coupled between a receiving node and a first node, has a gate coupled to the inverted low swing clock signal, and is capable of passing a data signal from the receiving node to the first node when the inverted low swing clock signal is at a logic high level. The first latch circuit is coupled between the first node and a second node, and is capable of inverting the data signal to generate a processed data signal on the second node when a set bar signal is at the logic high level and generating a logic high voltage as the processed data signal on the second node when the set bar signal is at a logic low level. The second NMOS transistor is coupled between the second node and a third node, has a gate coupled to the low swing clock signal, and is capable of passing the processed data signal from the second node to the third node when the low swing clock signal is at the logic high level. The second latch circuit is coupled between the third node and a fourth node, and is capable of inverting the processed data signal to generate an output signal on the fourth node when a reset bar signal is at the logic high level and generating a logic high voltage as the output signal at the fourth node when the reset bar signal is at the logic low level.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2:
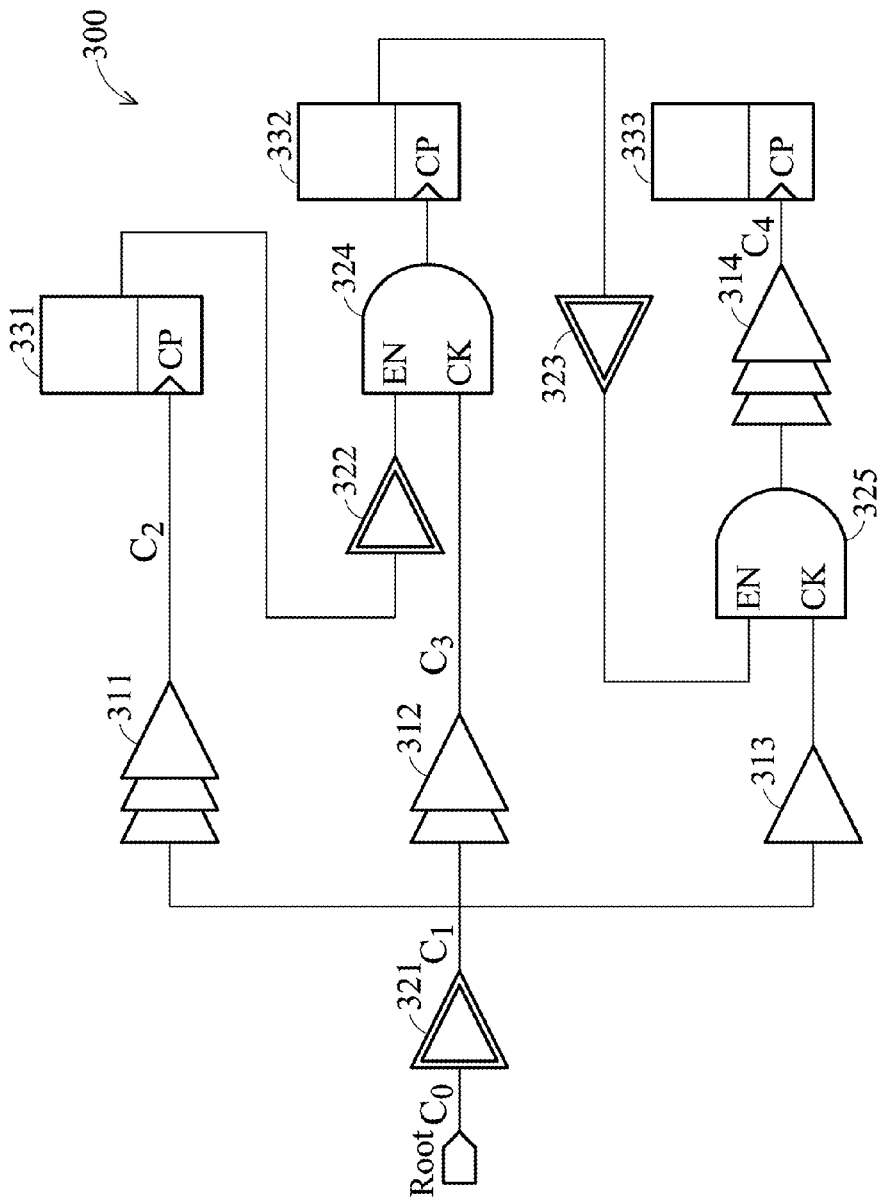
FIG. 2 is a schematic diagram of a circuit comprising a plurality of flip-flops capable of receiving a low swing clock signal according to the invention.

Referring to FIG. 2, a schematic diagram of a circuit 300 comprising a plurality of flip-flops capable of receiving a low swing clock signal according to the invention is shown. The circuit 300 comprises low swing clock buffers 311, 312, 313 and 314, low swing gates 324 and 325, and high-to-low level shifters 321, 322, and 323. In addition, the circuit 300 comprises three flip-flops 331, 332, and 333 capable of receiving a low swing clock signal. A voltage level of a source clock signal $C_0$ generated from a root can be reduced by the high-to-low level shifter 321 to generate a low swing clock signal $C_1$. The low swing clock signal $C_1$ is then sent to the low swing clock buffers 311, 312, and 313 to generate low swing clock signals $C_2$, $C_3$, and $C_4$. Because the flip-flops 331, 332, and 333 are capable of receiving low swing clock signals, the low swing clock signals $C_2$, $C_3$, and $C_4$ are then respectively delivered to the flip-flops 331, 332, and 333 without any intervening low-to-high level shifters. In comparison with the conventional circuits, the circuit 300 can normally operate without the low-to-high level shifters for converting a low swing clock signal to a high swing clock signal; thus, the manufacturing costs of the circuit 300 is decreased. In some embodiments, the high-to-low level shifters 321, 322 and 323 can be replaced with buffers.

Figure 3:
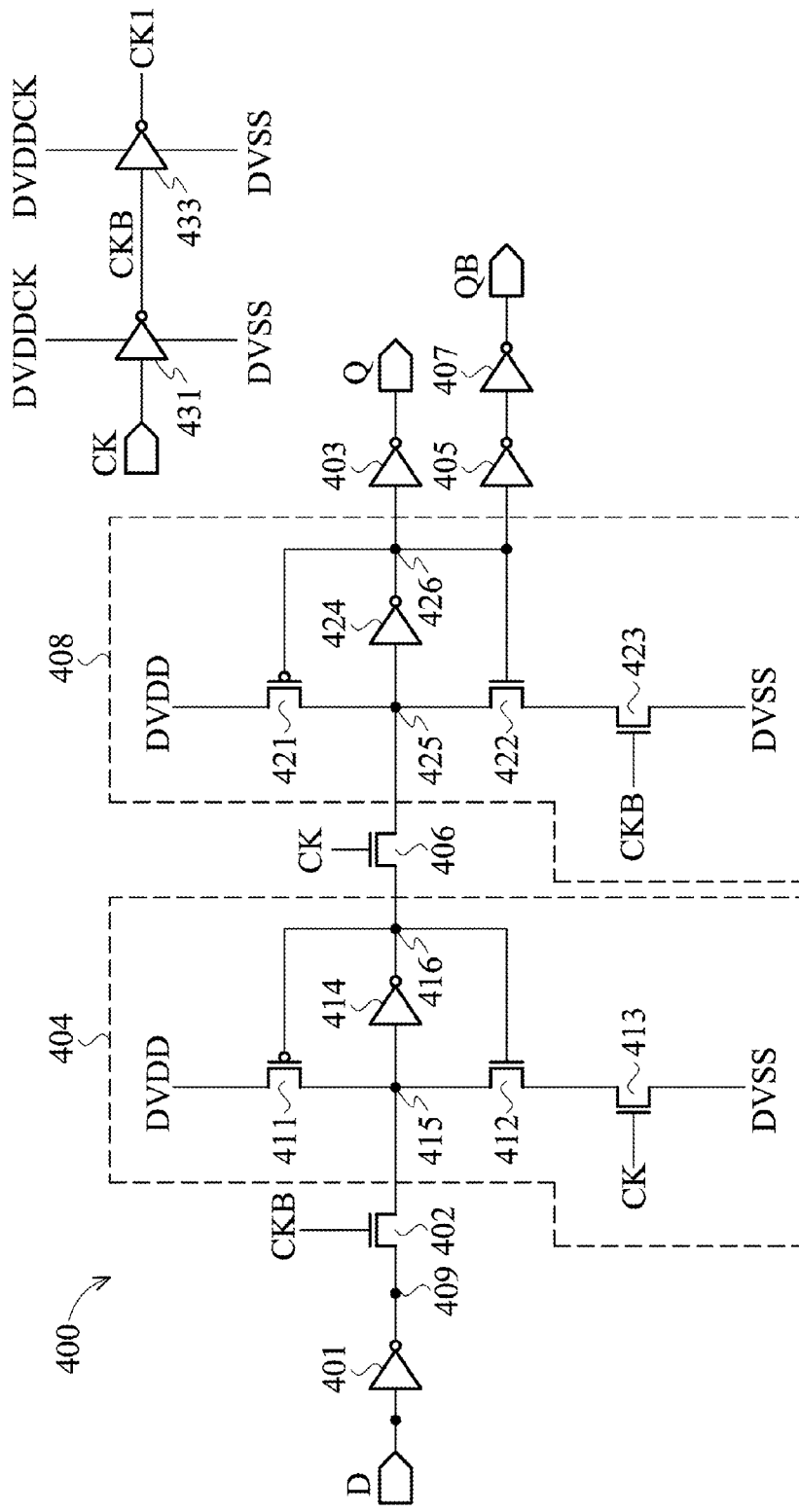
FIG. 3 is a circuit diagram of an embodiment of a flip-flop capable of receiving a low swing clock signal according to the invention.

Referring to FIG. 3, a circuit diagram of a flip-flop 400 capable of receiving a low swing clock signal according to the invention is shown. A low swing clock signal CK oscillates and can be inverted by an inverter 431 to generate an inverted low swing clock signal CKB. The flip-flop 400 may include inverters 401, 403, 405, and 407, passing gate circuits 402 and 406, and latch circuits 404 and 408. In some embodiments, the inverters 401, 403, 405, and 407 can be omitted. The inverter 401 is coupled between an input node and a receiving node 409, receives an input signal D from the input node and inverts the input signal D to generate a data signal at the receiving node 409. The passing gate circuit 402, a NMOS transistor according to this embodiment, is coupled between the node 409 and a node 415, and has a gate coupled to the inverted low swing clock signal CKB. When the inverted low swing clock signal CKB is at a logic high level, the NMOS transistor 402 passes the data signal from the node 409 to the node 415. The latch circuit 404 is coupled between the node 415 and a node 416, receives the data signal from the node 415, and can invert the data signal to generate an inverted data signal on the node 416. The passing gate circuit 406, a NMOS transistor according to this embodiment, is coupled between the node 416 and a node 425, and has a gate coupled to the low swing clock signal CK. When the low swing clock signal CK is at a logic high level, the NMOS transistor 406 passes the inverted data signal from the node 416 to the node 425. The latch circuit 408 is coupled between the node 425 and a node 426, receives the inverted data signal from the node 425, and can invert the inverted data signal to generate an output signal on the node 426. The inverter 403 coupled between the node 426 and an output node Q then inverts the output signal on the node 426 to generate an inverted output signal on the output node Q. The inverters 405 and 407 are coupled in series between the node 426 and an inverted output node QB, receive the output signal from the node 426 and generate the output signal on the inverted output node QB.

In one embodiment, the latch circuit 404 comprises a PMOS transistor 411, an inverter 414, and two NMOS transistors 412 and 413. The inverter 414 is coupled between the nodes 415 and 416, inverting the data signal on the node 415 to generate the inverted data signal on the node 416. The PMOS transistor 411 is coupled between a voltage source DVDD and the node 415, and the gate of the PMOS transistor 411 is coupled to the node 416. When the voltage on the node 416 is at a logic low level, the PMOS transistor 411 is turned on to raise the voltage of the node 415 to the level of the voltage source DVDD. The drain and gate of the NMOS transistor 412 are respectively coupled to the nodes 415 and 416. The NMOS transistor 413 is coupled between the source of the NMOS transistor 412 and a ground DVSS, and the gate of the NMOS transistor 413 is coupled to the low swing clock signal CK. When the low swing clock signal CK is at a logic high level, and the voltage on the node 416 is at a logic high level, both the NMOS transistors 412 and 413 are turned on to lower the voltage on the node 415 to the level of the ground DVSS.

In one embodiment, the latch circuit 408 comprises a PMOS transistor 421, an inverter 424, and two NMOS transistors 422 and 423. The inverter 424 is coupled between the nodes 425 and 426, inverting the inverted data signal on the node 425 to generate the output signal on the node 426. The PMOS transistor 421 is coupled between a voltage source DVDD and the node 425, and the gate of the PMOS transistor 421 is coupled to the node 426. When the voltage on the node 426 is at a logic low level, the PMOS transistor 421 is turned on to raise the voltage of the node 425 to the level of the voltage source DVDD. The drain and gate of the NMOS transistor 422 are respectively coupled to the nodes 425 and 426. The NMOS transistor 423 is coupled between the source of the NMOS transistor 422 and a ground DVSS, and the gate of the NMOS transistor 423 is coupled to the inverted low swing clock signal CKB. When the low swing clock signal CKB is at a logic high level, and the voltage on the node 426 is at a logic high level, both the NMOS transistors 422 and 423 are turned on to lower the voltage on the node 425 to the level of the ground DVSS.

When there is a new input signal D coming in, the inverted low swing clock signal CKB can be enabled to be at a logic high level and the low swing clock signal CK can be at a logic low level. Then the NMOS transistor 402 passes the data signal from the node 409 to the node 415 of the latch circuit 404, the NMOS transistor 413 cuts off the feedback path of the latch circuit 404, the NMOS transistor 406 is off, and the NMOS transistor 423 retains/builds the feedback path of the latch circuit 408. Then the latch circuit 404 receives the data signal from the node 415, and inverts the data signal to generate an inverted data signal on the node 416. Since the NMOS transistor 406 is off, instead of receiving inverted data signal corresponding to the new input signal D, the latch circuit 408 would latch an inverted data signal of last stage. Thus the value of an inverted output signal on the output node Q would be substantially equal to the value of last input signal instead of the new input signal D.

Next, the inverted low swing clock signal CKB can be changed to be at a logic low level and the low swing clock signal CK can be at a logic high level. Then the NMOS transistor 402 is off, the NMOS transistor 413 retains/builds the feedback path of the latch circuit 404, the NMOS transistor 406 passes the inverted data signal from the node 416 to the node 425 of the latch circuit 408, and the NMOS transistor 423 cuts off the feedback path of the latch circuit 408. The latch circuit 408 then inverts the inverted data signal to generate an output signal on the node 426. The inverter 403 then inverts the output signal on the node 426 to generate an inverted output signal on the output node Q, and the value of inverted output signal on the output node Q now is substantially equal to the value of the new input signal D.

Figure 1:
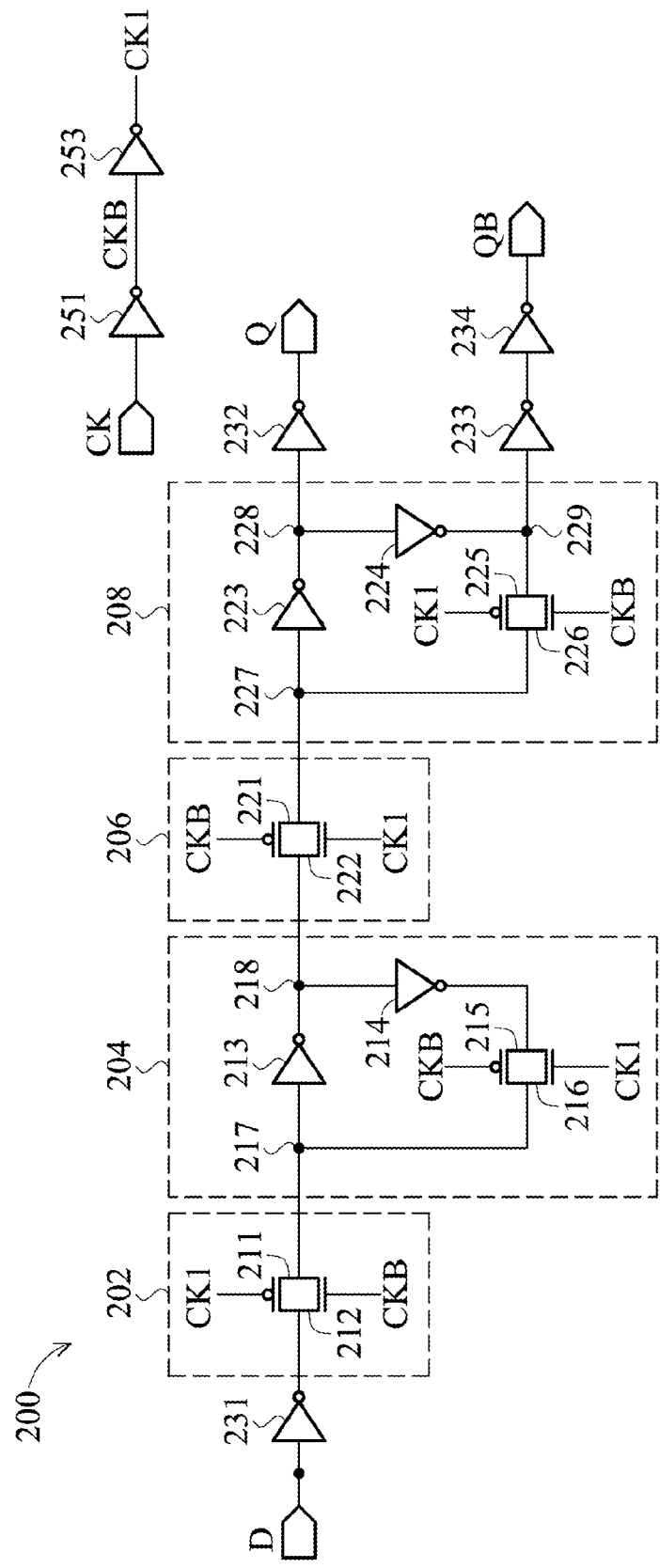
FIG. 1 is a circuit diagram of a conventional flip-flop.

The conventional flip-flop circuit 200 shown in FIG. 1 can only operate according to the clock signals CK1 and CKB with a normal swing level. If the swing levels of the clock signals CK1 and CKB are reduced to a low level, the PMOS transistors 211 and 221 of the passing gate circuits 202 and 206 cannot be completely turned off when the clock signals CK1 and CKB oscillates to a peak value with the low level, thus the passing gate circuits 202 and 206 cannot normally operate under the low swing clock signals CK1 and CKB. Similarly, if the swing levels of the clock signals CK1 and CKB are reduced to the low level, the PMOS transistors 215 and 225 of the latch circuits 204 and 208 cannot be completely turned off when the clock signals CK1 and CKB oscillates to the peak value with the low level, and the latch circuits 204 and 208 therefore cannot normally operate under the low swing clock signals CK1 and CKB. Contrarily, the flip-flop circuit 400 shown in FIG. 3 of the invention can normally operate according the clock signals CKB and CK with a low swing level. Because the passing gate circuits 402 and 406 include only NMOS transistors 402 and 406 without PMOS transistors, the NMOS transistors 402 and 406 can be completely turned off when the low swing clock signals CKB and CK oscillates to the peak value with a low level, and the passing gate circuits 402 and 406 therefore can normally operate according to the low swing clock signals CK and CKB. In addition, unlike the latch circuits 204 and 208 of the conventional flip-flop circuit 200, because the latch circuits 404 and 408 of the invention do not comprise PMOS transistors controlled by low swing clock signals CK and CKB, the latch circuits 404 and 408 of the invention can also normally operate according to the low swing clock signals CK and CKB. Thus, the flip-flop 400 provided by the invention normally operates according to the low swing clock signals CK and CKB.

Figure 4:
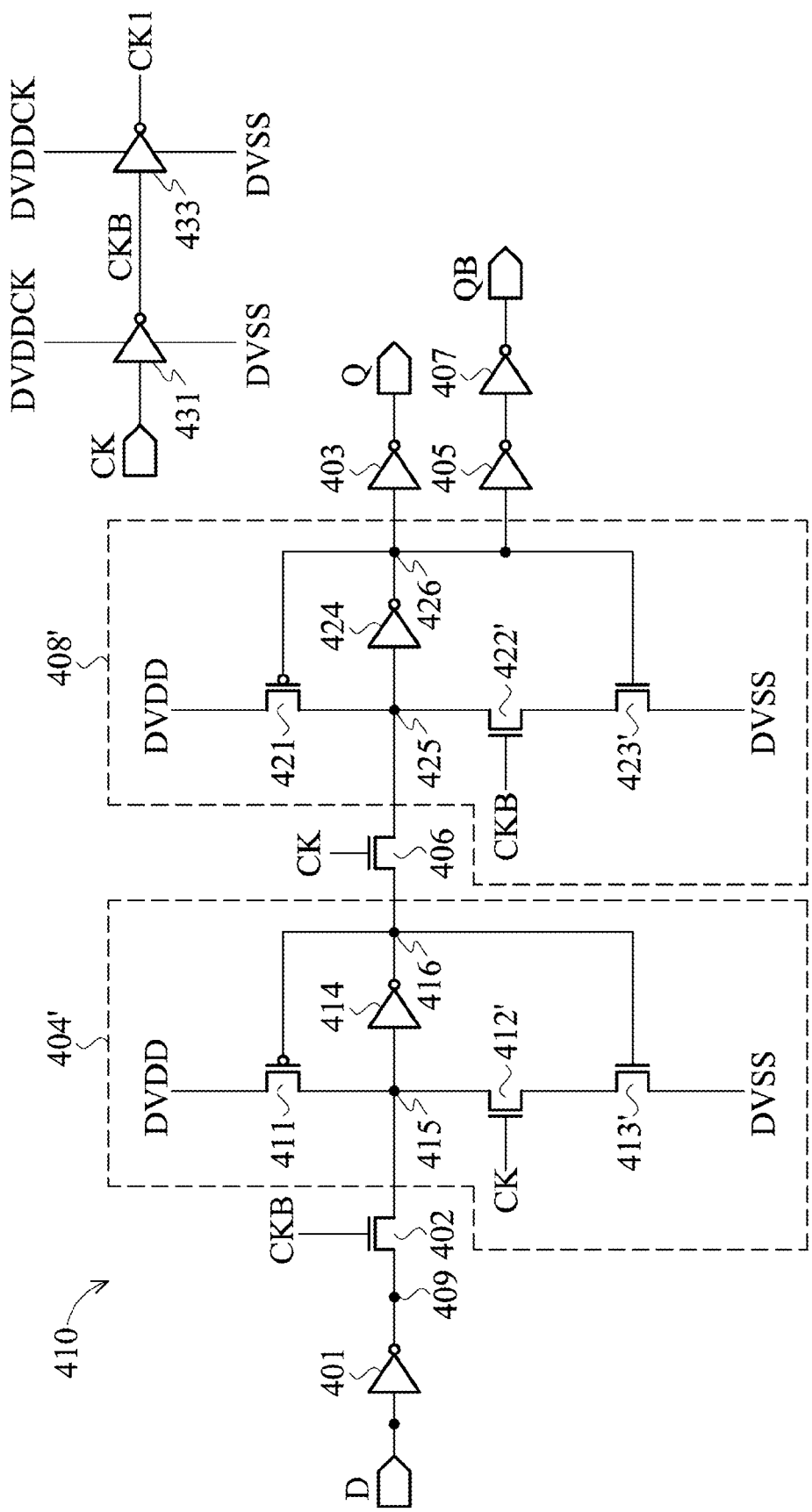
FIG. 4 is a circuit diagram of another embodiment of a flip-flop capable of receiving a low swing clock signal according to the invention.

Referring to FIG. 4, a circuit diagram of another embodiment of a flip-flop 410 capable of receiving a low swing clock signal according to the invention is shown. The flip-flop 410 shown in FIG. 4 comprises similar component circuits as those of the flip-flop 400 shown in FIG. 3. Similar components of the flip-flops 410 and 400 share the same index numbers. The difference between the flip-flop 410 shown in FIG. 4 and the flip-flop 400 shown in FIG. 3 resides in the latch circuits 404' and 408'. The latch circuit 404' shown in FIG. 4 comprises two NMOS transistors 412' and 413', wherein the gate of the NMOS transistor 412' is coupled to the low swing clock signal CK rather than the node 416, and the gate of the NMOS transistor 413' is coupled to the node 416 rather than the low swing clock signal CK. The latch circuit 404' shown in FIG. 4, however, has the similar function as that of the latch circuit 404 shown in FIG. 3. The latch circuit 408' shown in FIG. 4 comprises two NMOS transistors 422' and 423', wherein the gate of the NMOS transistor 422' is coupled to the inverted low swing clock signal CKB rather than the node 426, and the gate of the NMOS transistor 423' is coupled to the node 426 rather than the inverted low swing clock signal CKB. The latch circuit 408' shown in FIG. 4, however, has the similar function as that of the latch circuit 408 shown in FIG. 3.

Figure 5A:
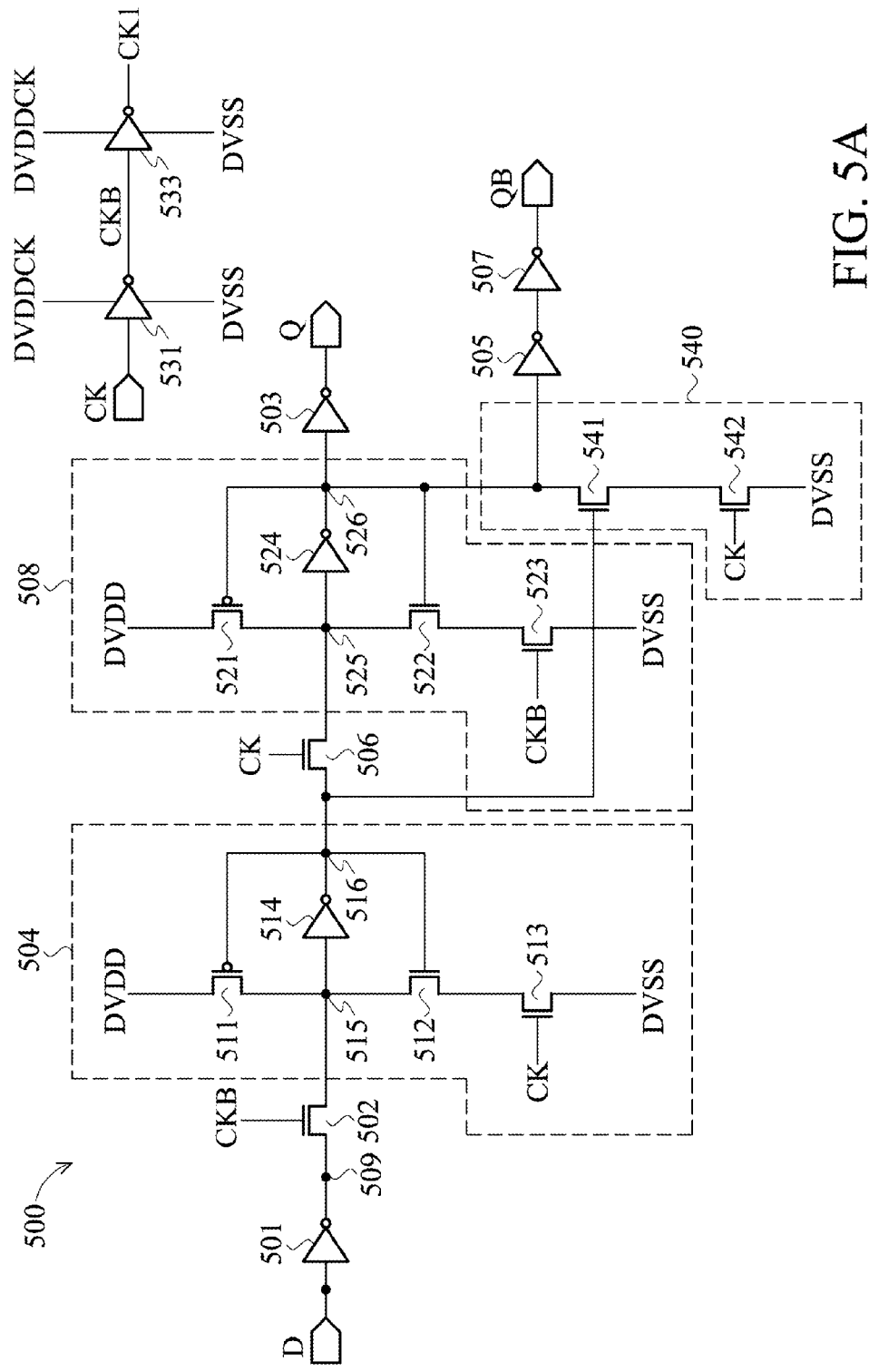
FIGS. 5A and 5B are circuit diagrams of two embodiments of a flip-flop comprising an input circuit increasing a signal generation speed according to the invention.

Referring to FIG. 5A, a circuit diagram of an embodiment of a flip-flop 500 comprising an input circuit 540 increasing a signal generation speed according to the invention is shown. The flip-flop 500 is controlled by low swing clock signals CK and CKB and has similar components to that of the flip-flop 400 shown in FIG. 3. The flip-flop 500 may include inverters 501, 503, 505, and 507, two passing gate circuits 502 and 506, and two latch circuits 504 and 508, wherein similar components of the flip-flops 500 and 400 have corresponding index numbers. In some embodiments, the inverters 501, 503, 505, and 507 can be omitted. The flip-flop 500 further comprises an input circuit 540 for enabling the latch circuit 508 to speed up generation of the output signal on the node 526. The input circuit 540 is coupled between the nodes 516 and 526 and comprises two NMOS transistors 541 and 542. The gate and drain of the NMOS transistor 541 are respectively coupled to the nodes 516 and 526. The NMOS transistor 542 is coupled between the source of the NMOS transistor 541 and a ground DVSS, and the gate of the NMOS transistor 542 is coupled to the low swing clock signal CK. When the voltage of the node 516 and the low swing clock signal CK are both at a logic high level, the NMOS transistors 541 and 542 are turned on to lower the voltage of the node 526 to the ground DVSS, thereby speeding up generation of the output signal on the node 526. In some embodiments, positions of the NMOS transistors 541 and 542 can be swapped with each other, with the gate of the NMOS transistor 541 still coupled to the node 516 and the gate of the NMOS transistor 542 still coupled to the low swing clock signal CK.

Figure 5B:
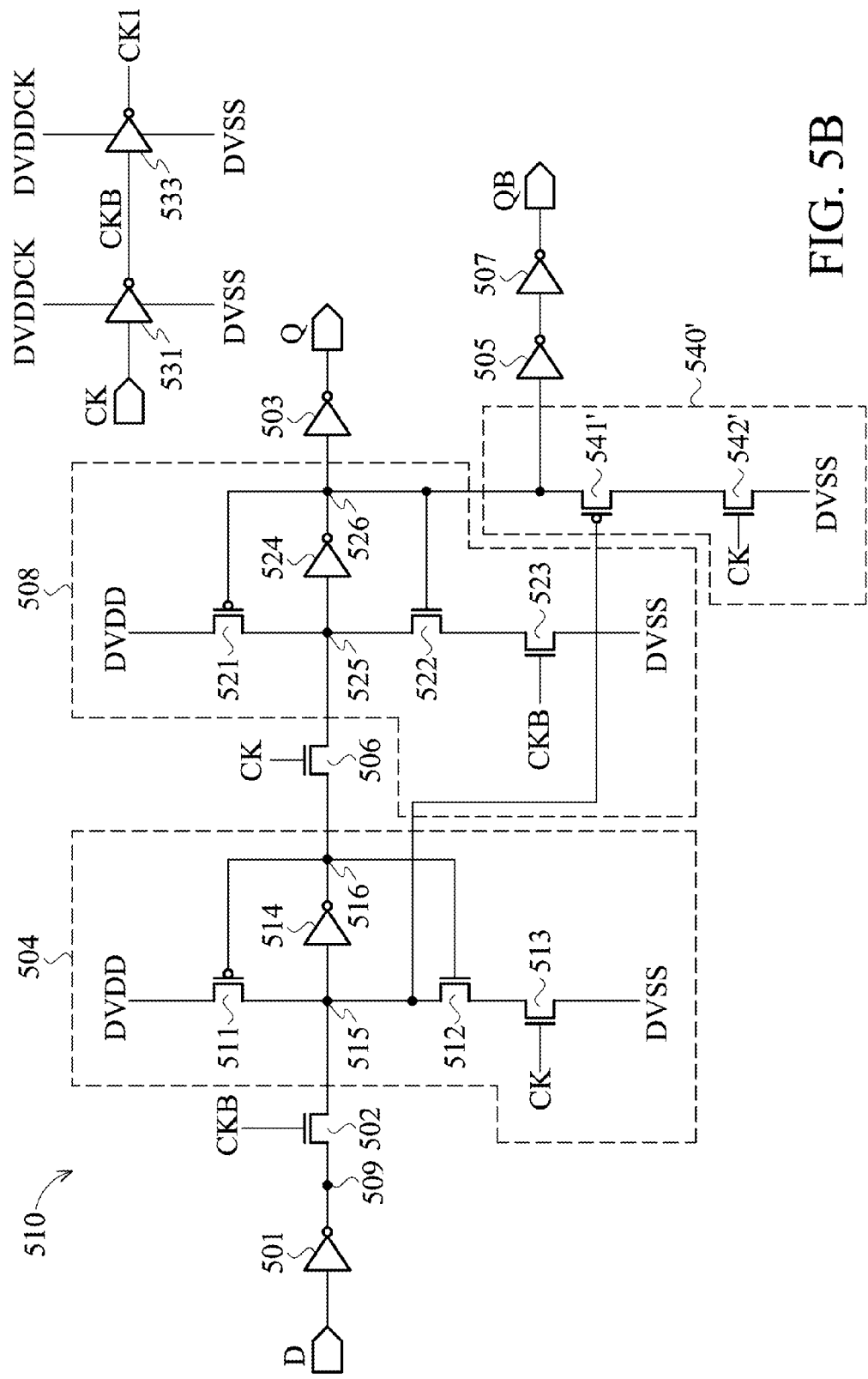

Referring to FIG. 5B, a circuit diagram of another embodiment of a flip-flop 510 comprising an input circuit 540' increasing a signal generation speed according to the invention is shown. The flip-flop 510 has a similar circuit structure to that of the flip-flop 500 shown in FIG. 5A. Similar component circuits of the flip-flops 500 and 510 have the same index numbers. The difference between the flip-flops 510 and 500 resides in the input circuit 540' which enables the latch circuit 508 to speed up generation of the output signal on the node 526 as the input circuit 540 of FIG. 5A. The input circuit 540' is coupled between the nodes 515 and 526 and comprises a PMOS transistor 541' and an NMOS transistor 542'. The gate and source of the PMOS transistor 541' are respectively coupled to the nodes 515 and 526. The NMOS transistor 542' is coupled between the drain of the PMOS transistor 541' and a ground DVSS, and the gate of the NMOS transistor 542' is coupled to the low swing clock signal CK. When the voltage of the node 515 is at a logic low level and the low swing clock signal CK is at a logic high level, the PMOS transistor 541' and the NMOS transistor 542' are both turned on to lower the voltage of the node 526 to the ground DVSS, thereby speeding up generation of the output signal on the node 526. Thus, the NMOS transistor 541 of the input circuit 540 shown in FIG. 5A can be replaced with the PMOS transistor 541' of the input circuit 540' shown in FIG. 5B. In some embodiments, positions of the transistors 541' and 542' can be swapped with each other, with the gate of the PMOS transistor 541' still coupled to the node 515 and the gate of the NMOS transistor 542' still coupled to the low swing clock signal CK.

Figure 5C:
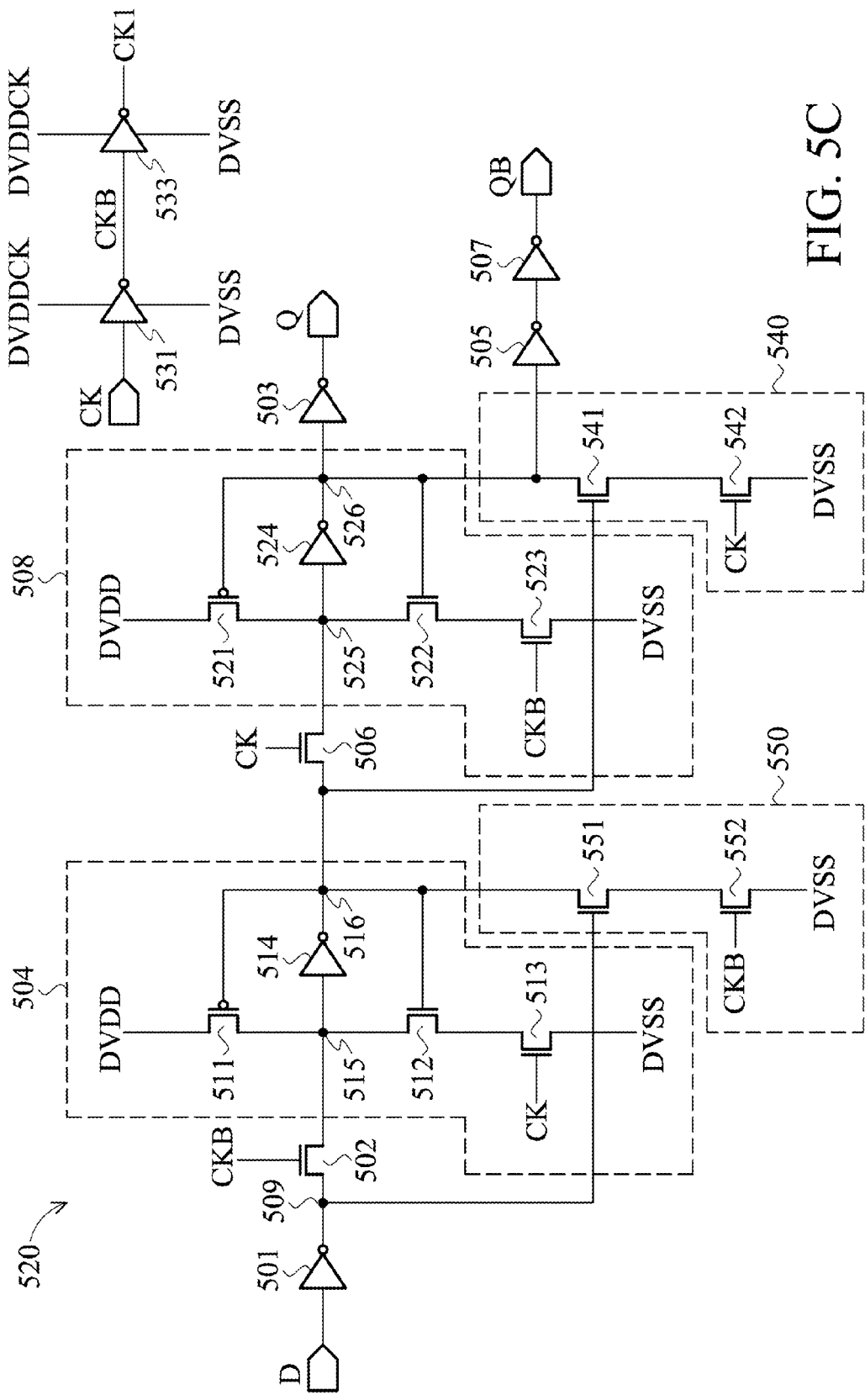
FIGS. 5C, 5D, 5E, and 5F are circuit diagrams of four embodiments of a flip-flop comprising two input circuits increasing a signal generation speed according to the invention.

Referring to FIG. 5C, a circuit diagram of another embodiment of a flip-flop 520 comprising two input circuits 540 and 550 increasing a signal generation speed according to the invention is shown. The flip-flop 520 has a similar circuit structure to that of the flip-flop 500 shown in FIG. 5A. Similar component circuits of the flip-flops 500 and 520 have the same index numbers. The difference between the flip-flops 520 and 500 resides in the input circuit 550 which enables the latch circuit 504 to speed up generation of the inverted data signal on the node 516. The input circuit 550 is coupled between the nodes 509 and 516 and comprises two NMOS transistors 551 and 552. The gate and drain of the NMOS transistor 551 are respectively coupled to the nodes 509 and 516. The NMOS transistor 552 is coupled between the source of the NMOS transistor 551 and a ground DVSS, and the gate of the NMOS transistor 552 is coupled to the inverted low swing clock signal CKB. When the voltage on the node 509 and the inverted low swing clock signal CKB are both at a logic high level, the NMOS transistors 551 and 552 are both turned on to lower the voltage of the node 516 to the ground DVSS, thereby speeding up generation of the inverted data signal on the node 516. In some embodiments, positions of the NMOS transistors 541 and 542 can be swapped with each other, with the gate of the NMOS transistor 541 still coupled to the node 516 and the gate of the NMOS transistor 542 still coupled to the low swing clock signal CK. In some embodiments, positions of the NMOS transistors 551 and 552 can be swapped with each other, with the gate of the NMOS transistor 551 still coupled to the node 509 and the gate of the NMOS transistor 552 still coupled to the inverted low swing clock signal CKB.

Figure 5D:
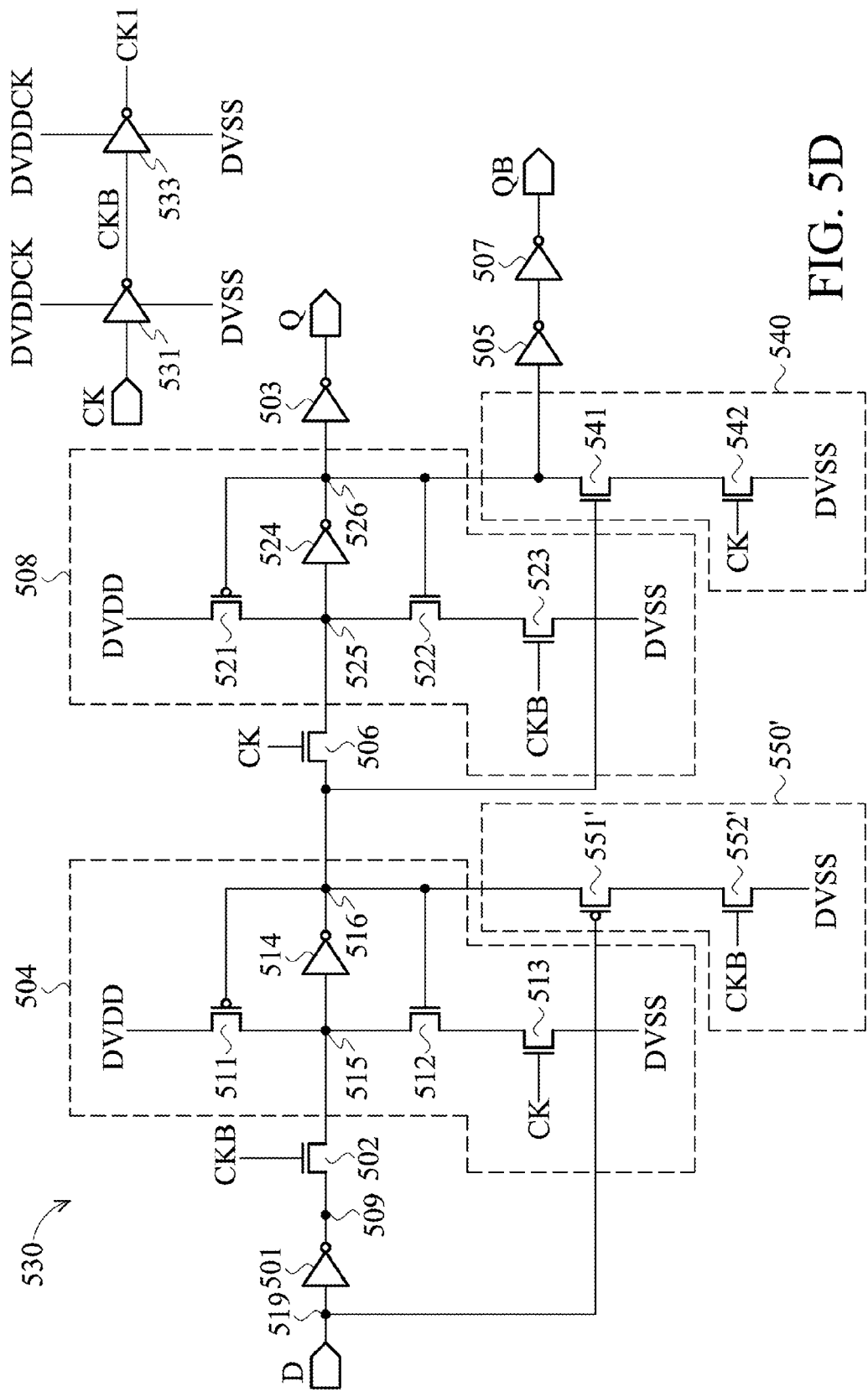

Referring to FIG. 5D, a circuit diagram of another embodiment of a flip-flop 530 comprising two input circuits 540 and 550' increasing a signal generation speed according to the invention is shown. The flip-flop 530 has a similar circuit structure to that of the flip-flop 500 shown in FIG. 5A. Similar component circuits of the flip-flops 500 and 530 have the same index numbers. The difference between the flip-flops 530 and 500 resides in the input circuit 550' which enables the latch circuit 504 to speed up generation of the inverted data signal on the node 516. The input circuit 550' is coupled between the input node 519 and the node 516 and comprises a PMOS transistor 551' and an NMOS transistor 552'. The gate and source of the PMOS transistor 551' are respectively coupled to the nodes 519 and 516. The NMOS transistor 552' is coupled between the drain of the PMOS transistor 551' and a ground DVSS, and the gate of the NMOS transistor 552' is coupled to the inverted low swing clock signal CKB. When the voltage of the node 519 is at a logic low level and the inverted low swing clock signal CKB is at a logic high level, the PMOS transistor 551' and the NMOS transistor 552' are both turned on to lower the voltage of the node 516 to the ground DVSS, thereby speeding up generation of the output signal on the node 516. Thus, the NMOS transistor 551 of the input circuit 550 shown in FIG. 5C can be replaced with the PMOS transistor 551' of the input circuit 550' shown in FIG. 5D. In some embodiments, positions of the NMOS transistors 541 and 542 can be swapped with each other, with the gate of the NMOS transistor 541 still coupled to the node 516 and the gate of the NMOS transistor 542 still coupled to the low swing clock signal CK. In some embodiments, positions of the transistors 551' and 552' can be swapped with each other, with the gate of the PMOS transistor 551' still coupled to the node 519 and the gate of the NMOS transistor 552' still coupled to the inverted low swing clock signal CKB.

Figure 5E:
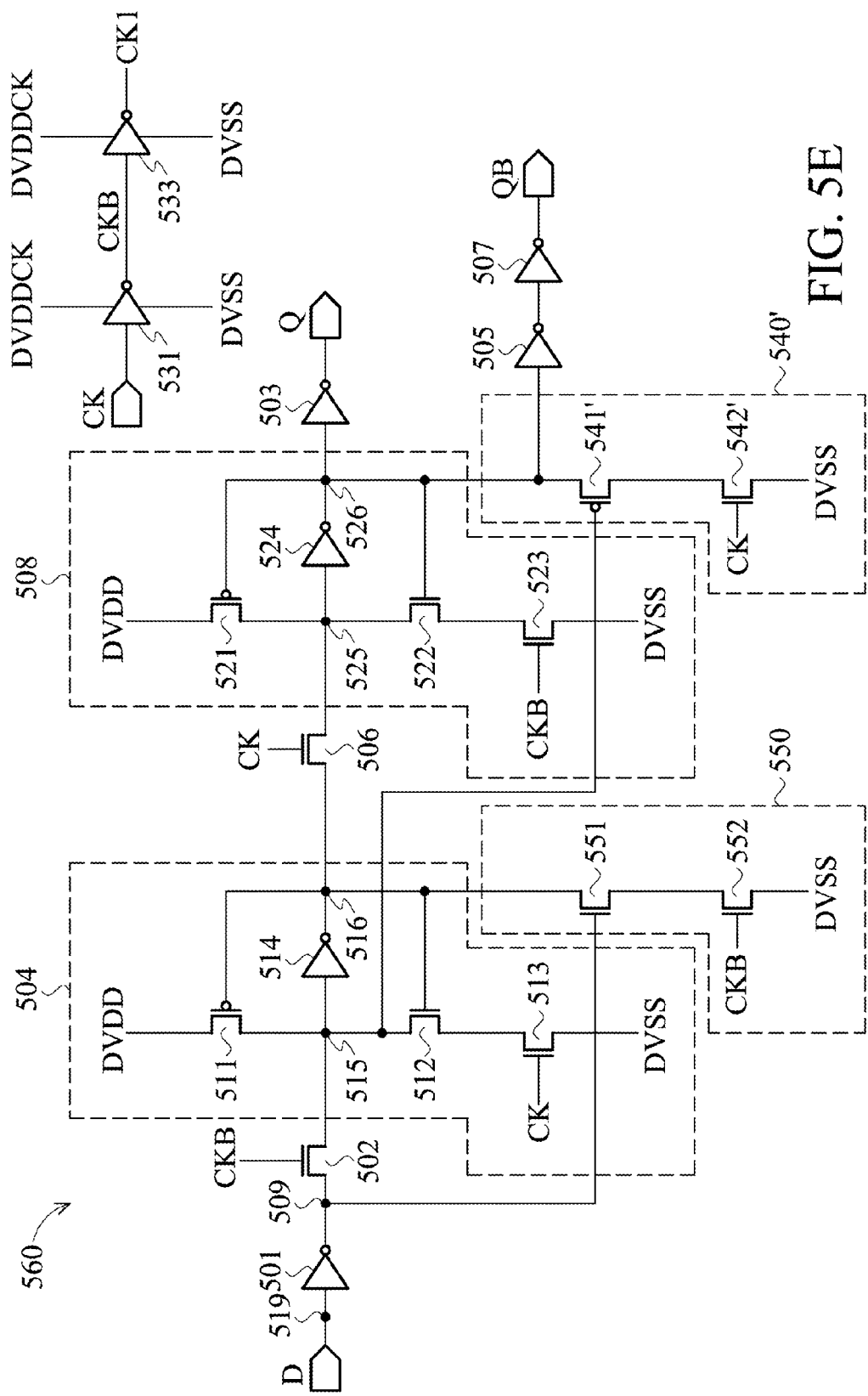
Figure 5F:
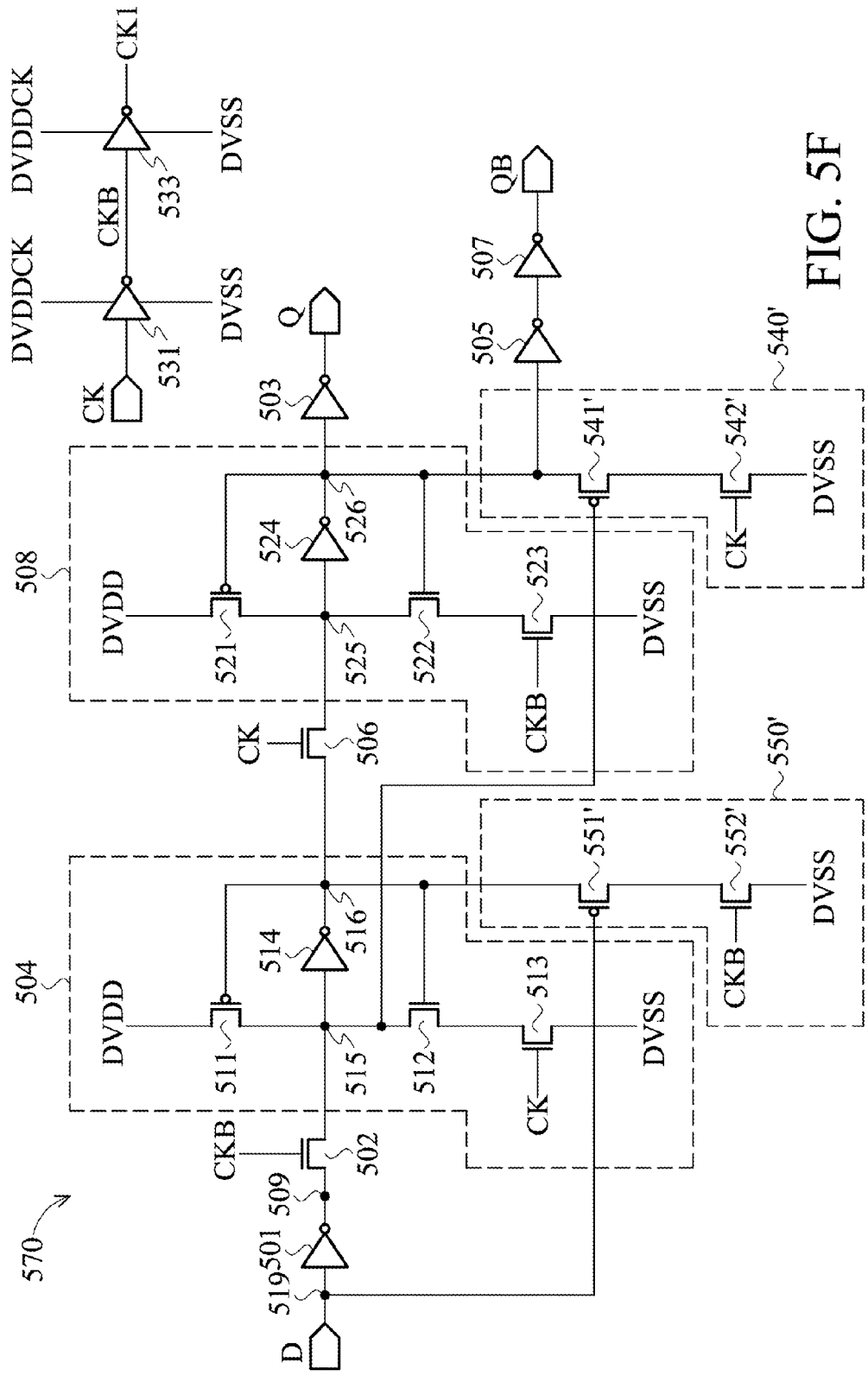

FIGS. 5E and 5F are circuit diagrams of another two embodiments of flip-flops 560 and 570 comprising two input circuits. The flip-flop 560 shown in FIG. 5E has similar structure to that of the flip-flop 520 shown in FIG. 5C, except that the input circuit 540 of the flip-flop 520 is replaced with the input circuit 540' shown in FIG. 5B. The flip-flop 570 shown in FIG. 5F has similar circuit structure to that of the flip-flop 530 shown in FIG. 5D, except that the input circuit 540 of the flip-flop 530 is replaced with the input circuit 540' shown in FIG. 5B. In some embodiments, positions of the transistors 541' and 542' can be swapped with each other, with the gate of the PMOS transistor 541' still coupled to the node 515 and the gate of the NMOS transistor 542' still coupled to the low swing clock signal CK. In some embodiments, positions of the NMOS transistors 551 and 552 of FIG. 5E can be swapped with each other, with the gate of the NMOS transistor 551 still coupled to the node 509 and the gate of the NMOS transistor 552 still coupled to the inverted low swing clock signal CKB. In some embodiments, positions of the transistors 551' and 552' of FIG. 5F can be swapped with each other, with the gate of the PMOS transistor 551' still coupled to the node 519 and the gate of the NMOS transistor 552' still coupled to the inverted low swing clock signal CKB.

Figure 5G:
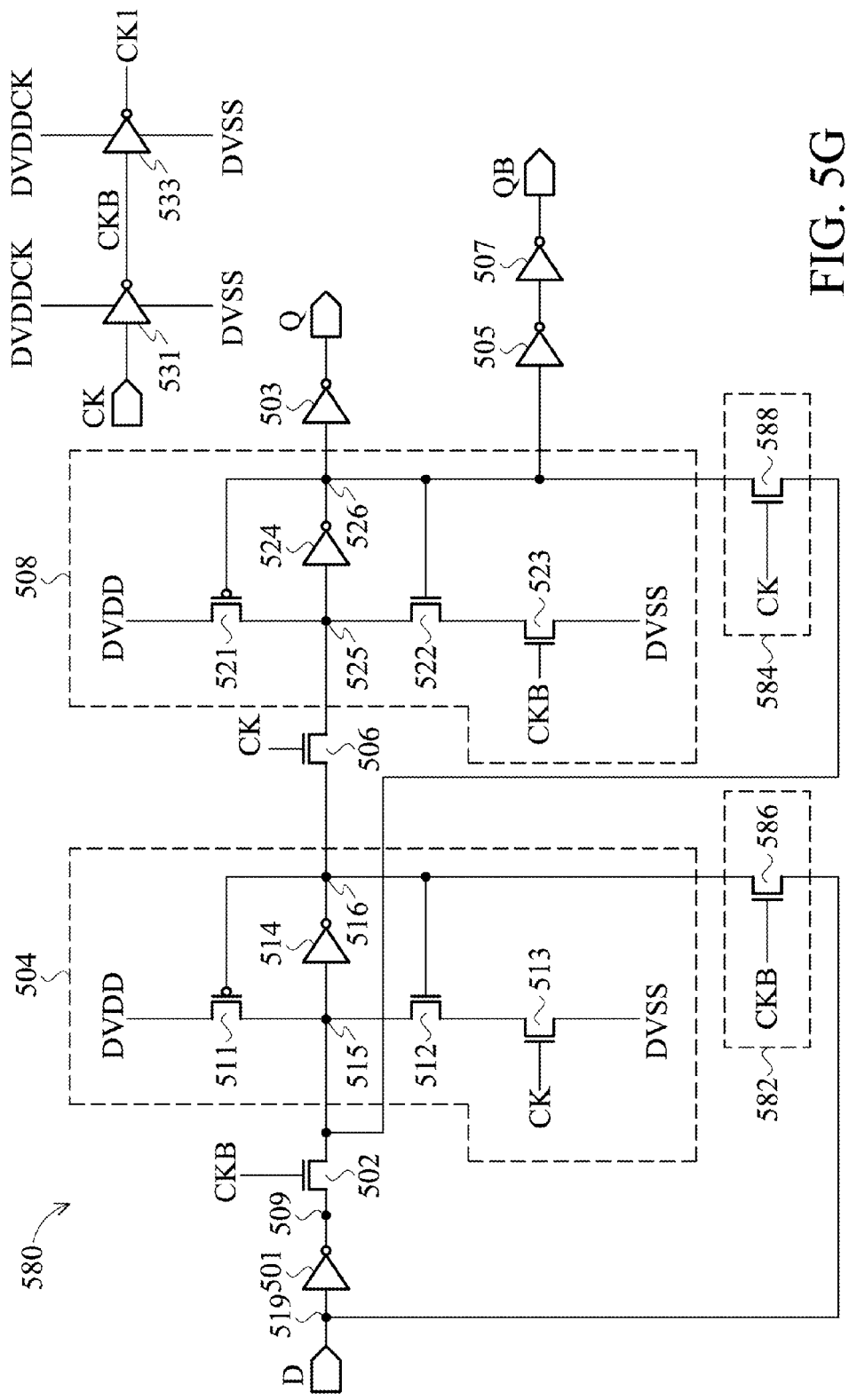
FIGS. 5G and 5H are circuit diagrams of another two embodiments of a flip-flop comprising two input circuits increasing a signal generation speed according to the invention.
Figure 5H:
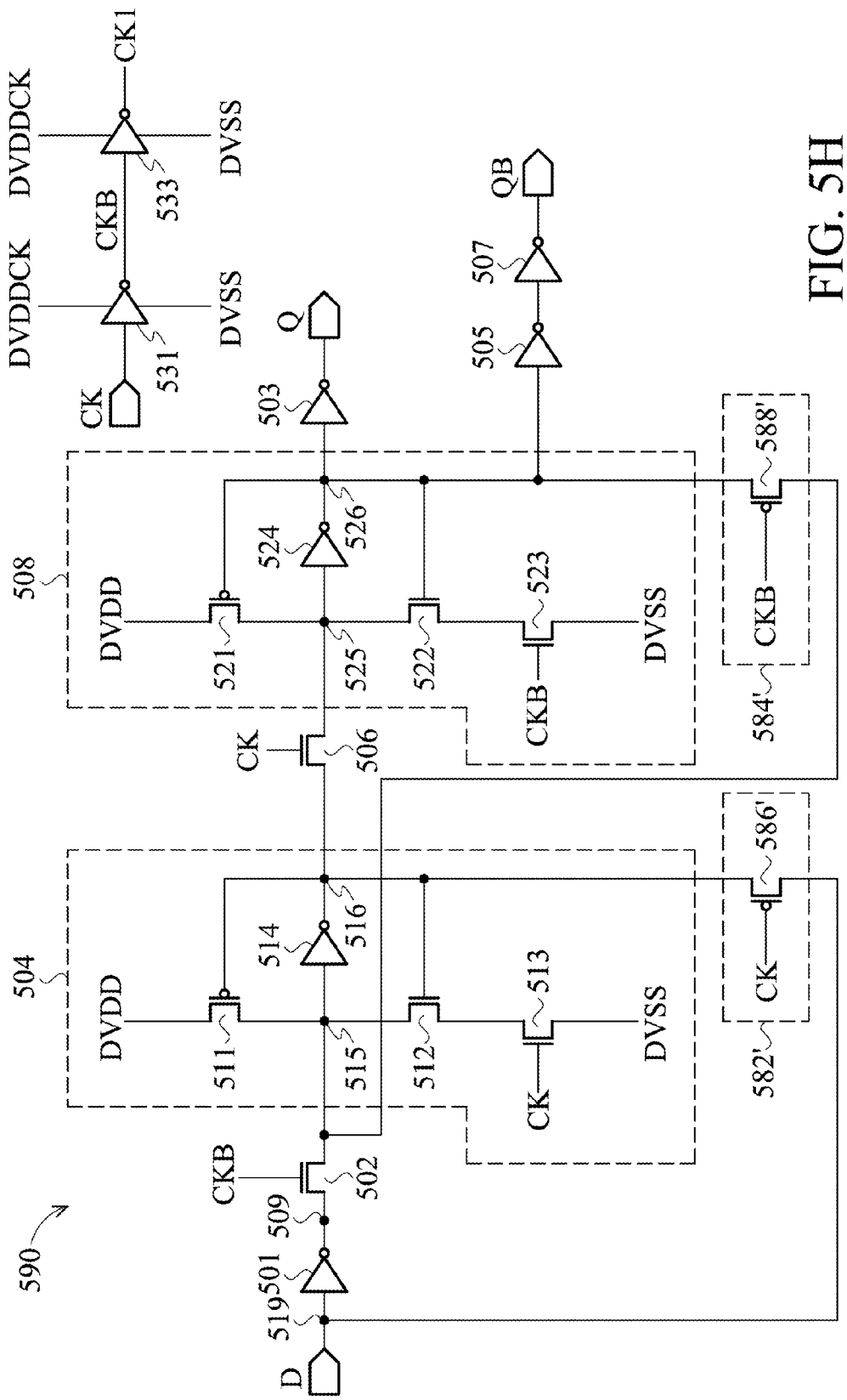

FIGS. 5G and 5H are circuit diagrams of another two embodiments of flip-flops 580 and 590 comprising two input circuits. The flip-flop 580 shown in FIG. 5G has similar circuit structure to that of the flip-flop 570 shown in FIG. 5F, except that the input circuits 550' and 540' of the flip-flop 570 are respectively replaced with the input circuits 582 and 584 shown in FIG. 5G. The input circuit 582 includes an NMOS transistor 586. The NMOS transistor 586 is coupled between the input node 519 and the node 516, and the gate of the NMOS transistor 586 is coupled to an inverted low swing clock signal CKB. When the inverted low swing clock signal CKB is at a logic high level, the NMOS transistor 586 is turned on to couple the node 519 with the node 516, thereby speeding up the signal transmission between the nodes 519 and 516. The input circuit 584 comprises an NMOS transistor 588. The NMOS transistor 588 is coupled between the nodes 515 and 526, and the gate of the NMOS transistor 588 is coupled to a low swing clock signal CK. When the low swing clock signal CK is at a logic high level, the NMOS transistor 588 is turned on to couple the node 515 with the node 526, thereby speeding up the signal transmission between the nodes 515 and 526. The flip-flop 590 shown in FIG. 5H has similar circuit structure to that of the flip-flop 580 shown in FIG. 5G, except that NMOS transistors 586 and 588 of the input circuits 582 and 584 of the flip-flop 580 shown in FIG. 5G are respectively replaced with the PMOS transistors 586' and 588' of the input circuits 582' and 584' shown in FIG. 5H. When the low swing clock signal CK is at a logic low level, the PMOS transistor 586' is turned on to couple the node 519 with the node 516, thereby speeding up the signal transmission between the nodes 519 and 516. When the inverted low swing clock signal CKB is at a logic low level, the PMOS transistor 588' is turned on to couple the node 515 with the node 526, thereby speeding up the signal transmission between the nodes 515 and 526.

In some embodiments, the NMOS transistors 512 and 513 of the latch circuit 504 shown in FIGS. 5A-5H can be replaced with the NMOS transistors 412' and 413' of the latch circuit 404' shown in FIG. 4. And the NMOS transistors 522 and 523 of the latch circuit 508 shown in FIGS. 5A-5H can be replaced with the NMOS transistors 422' and 423' of the latch circuit 408' shown in FIG. 4.

Figure 6:
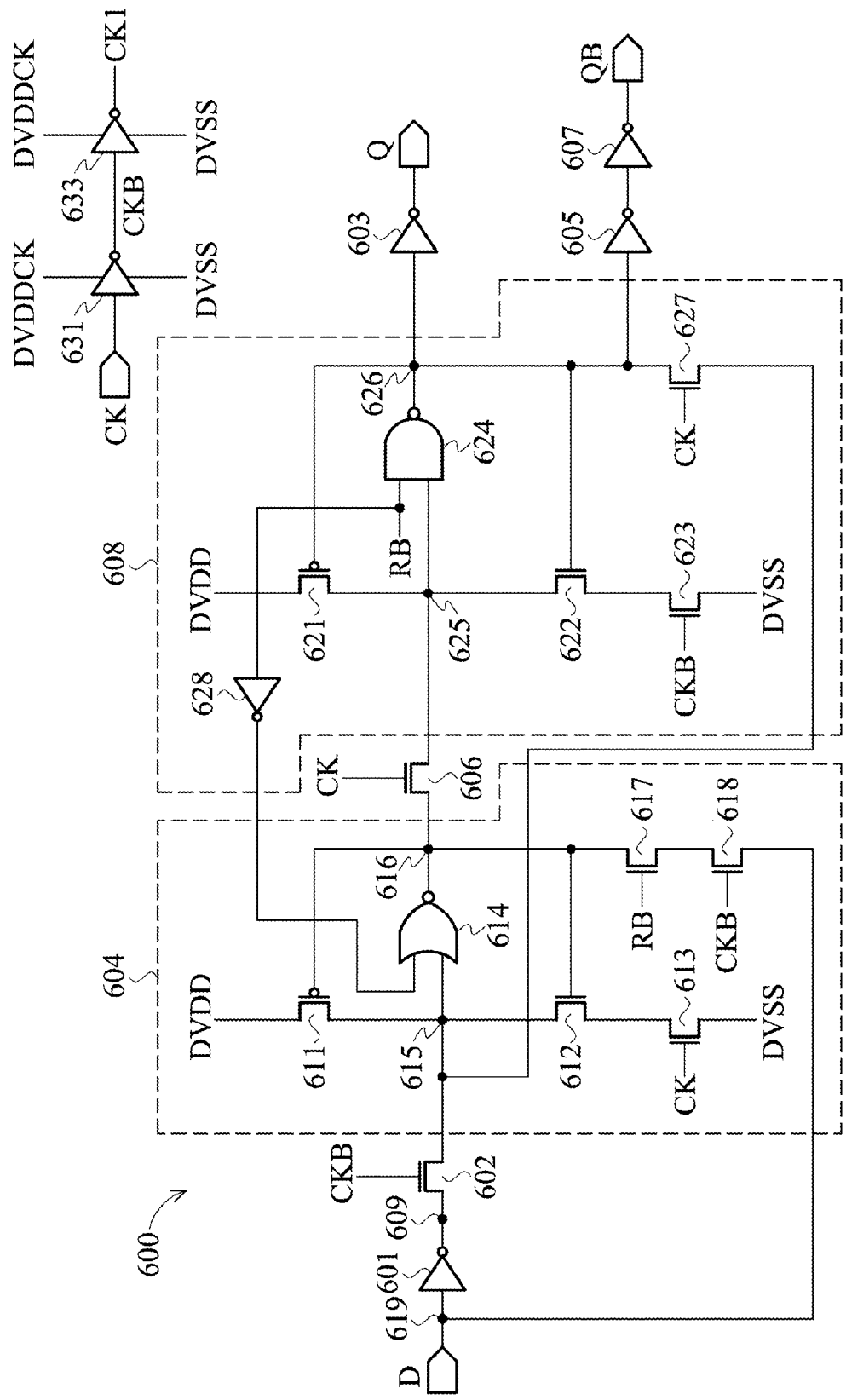
FIG. 6 is a circuit diagram of an embodiment of a flip-flop receiving a reset bar signal according to the invention.

Referring to FIG. 6, a circuit diagram of an embodiment of a flip-flop 600 receiving a reset bar signal according to the invention is shown. The flip-flop 600 has a similar circuit structure and circuit function to those of the flip-flop 580 shown in FIG. 5G. In one embodiment, the flip-flop 600 includes inverters 601, 603, 605, and 607, two passing gate circuits 602 and 606, and latch circuits 604 and 608. In some embodiments, the inverters 601, 603, 605, and 607 can be omitted. A reset bar signal RB is used to reset the output voltage on the output node Q to a logic low voltage when the reset bar signal RB is at a logic low level. The passing gate circuit 602, a NMOS transistor according to this embodiment, is coupled between a receiving node 609 and a node 615, has a gate coupled to the inverted low swing clock signal CKB, receives a data signal from the receiving node 609, and passing the data signal from the receiving node 609 to the node 615 when the inverted low swing clock signal CKB is at a logic high level. When an inverted low swing clock signal CKB is at a logic high level, the NMOS transistor 602 is turned on to pass the data signal from the node 609 to the node 615. The latch circuit 604 coupled between the node 615 and a node 616 receives the data signal from the node 615, and can invert the data signal to generate a processed data signal on the node 616 when the reset bar signal RB is at a logic high level. The passing gate circuit 606, a NMOS transistor according to this embodiment, is coupled between the node 616 and a node 625, has a gate coupled to the low swing clock signal CK, and passes the processed data signal from the node 616 to the node 625 when the low swing clock signal CK is at a logic high level. When the low swing clock signal CK is at a logic high level, the NMOS transistor 606 is turned on to pass the processed data signal from the node 616 to the node 625. The latch circuit 608 coupled between the node 625 and a node 626 receives the processed data signal from the node 625, and can invert the processed data signal to generate an output signal on the node 626 when the reset bar signal RB is at a logic high level, and generates a logic high voltage on the node 626 when the reset bar signal RB is at a logic low level. When the reset bar signal RB is at a logic low level, the latch circuit 608 generates a logic high voltage as the output signal on the node 626, and the inverter 603 inverts the logic high voltage on the node 626 to generate a logic low voltage on the output node Q.

The latch circuit 608 has a similar circuit structure to that of a combination of the latch circuit 508 and the input circuit 584 shown in FIG. 5G. The difference between the latch circuit 608 and a combination of the latch circuit 508 and the input circuit 584 resides in a NAND gate 624. The NAND gate 624 performs an NAND operation on the reset bar signal RB and the processed data signal of the node 625 to generate an output signal on the node 626. Thus, when the reset bar signal RB is at a logic low level, the latch circuit 608 generates a logic high voltage as the output signal on the node 626.

The latch circuit 604 has a similar circuit structure to that of a combination of the latch circuit 504 and the input circuit 582 shown in FIG. 5G. A difference between the latch circuit 604 and the combination of the latch circuit 504 and the input circuit 582 is a NOR gate 614. The NOR gate 614 performs an NOR operation on an inverted reset bar signal and the data signal of the node 615 to generate the processed data signal on the node 616. Thus, when the reset bar signal RB is at a logic high level, the NOR gate 614 acts as an inverter inverting the data signal on the node 615 to generate the processed data signal on the node 616. Another difference between the latch circuit 604 and the combination of the latch circuit 504 and the input circuit 582 is the NMOS transistor 617 coupled between the node 616 and the drain of the NMOS transistor 618. The gate of the NMOS transistor 617 is coupled to the reset bar signal. When the reset bar signal RB is at a logic low level, the NMOS transistor 617 is turned off to disconnect the data path from the node 619 to the node 616.

When the reset bar signal RB is at a logic high level, and when there is a new input signal D coming in, the inverted low swing clock signal CKB can be enabled to be at a logic high level and the low swing clock signal CK can be at a logic low level. Then the NMOS transistor 602 passes the data signal from the node 609 to the node 615 of the latch circuit 604, the NMOS transistor 613 cuts off the feedback path of the latch circuit 604, the NMOS transistor 606 is off, and the NMOS transistor 623 retains/builds the feedback path of the latch circuit 608. Then the latch circuit 604 receives the data signal from the node 615, and inverts the data signal to generate an inverted data signal on the node 616. Since the NMOS transistor 606 is off, instead of receiving inverted data signal corresponding to the new input signal D, the latch circuit 608 would latch an inverted data signal of last stage. Thus the value of an inverted output signal on the output node Q would be substantially equal to the value of last input signal instead of the new input signal D. Next, the inverted low swing clock signal CKB can be changed to be at a logic low level and the low swing clock signal CK can be at a logic high level. Then the NMOS transistor 602 is off, the NMOS transistor 613 retains/builds the feedback path of the latch circuit 604, the NMOS transistor 606 passes the inverted data signal from the node 616 to the node 625 of the latch circuit 608, and the NMOS transistor 623 cuts off the feedback path of the latch circuit 608. The latch circuit 608 then inverts the inverted data signal to generate an output signal on the node 626. The inverter 603 then inverts the output signal on the node 626 to generate an inverted output signal on the output node Q, and the value of inverted output signal on the output node Q now is substantially equal to the value of the new input signal D. When the reset bar signal RB is at a logic low level, the latch circuit 608 generates a logic high voltage on the node 626, and then the value of the signal on the output node Q is reset as logic low.

In some embodiments, the NMOS transistors 612 and 613 of the latch circuit 604 shown in FIG. 6 can be replaced with the NMOS transistors 412' and 413' of the latch circuit 404' shown in FIG. 4. And the NMOS transistors 622 and 623 of the latch circuit 608 shown in FIG. 6 can be replaced with the NMOS transistors 422' and 423' of the latch circuit 408' shown in FIG. 4.

Figure 7:
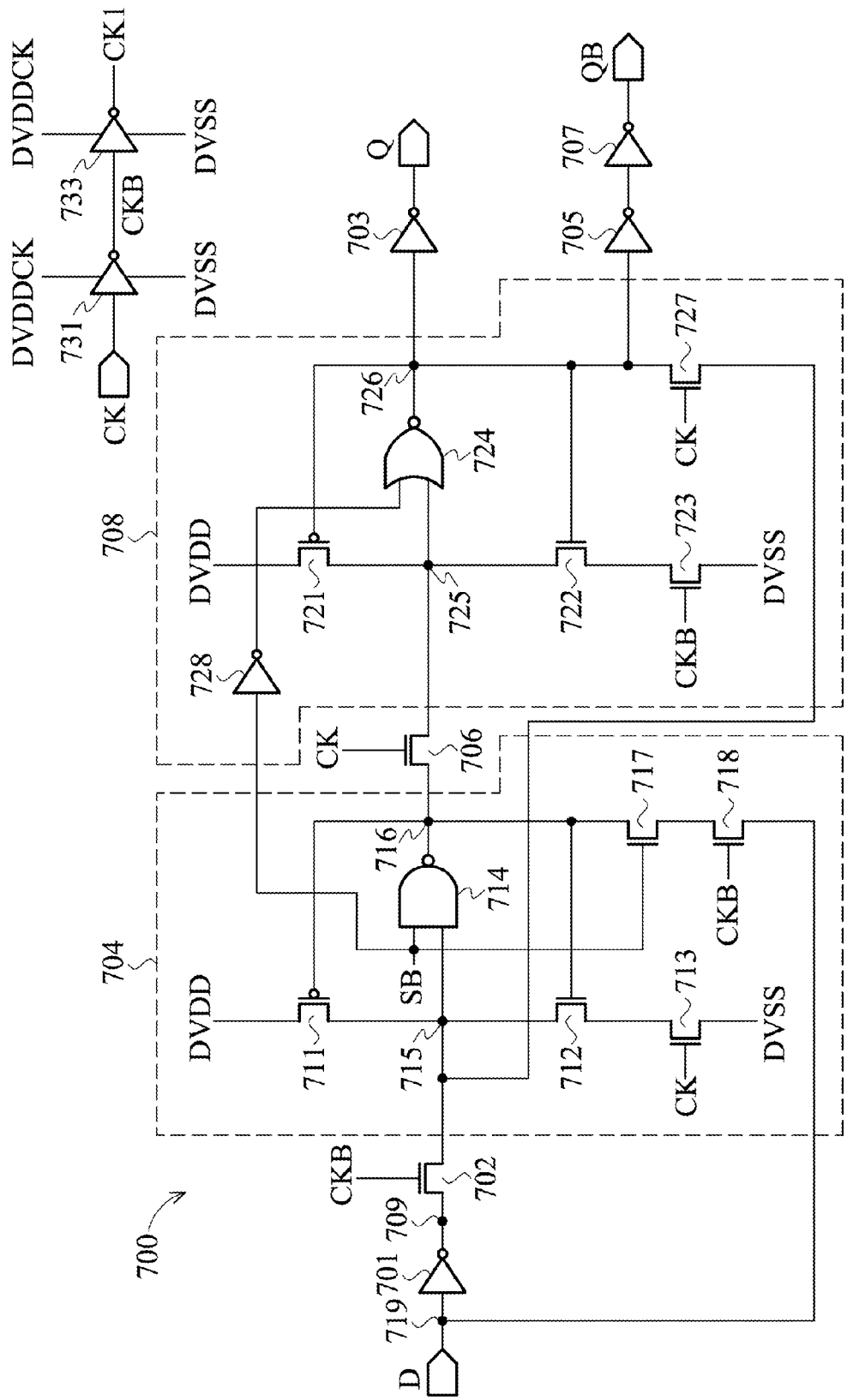
FIG. 7 is a circuit diagram of an embodiment of a flip-flop receiving a set bar signal according to the invention.

Referring to FIG. 7, a circuit diagram of an embodiment of a flip-flop 700 receiving a set bar signal according to the invention is shown. The flip-flop 700 has a similar circuit structure and circuit function as those of the flip-flop 580 shown in FIG. 5G. In one embodiment, the flip-flop 700 includes inverters 701, 703, 705, and 707, two passing gate circuits 702 and 706, and latch circuits 704 and 708. In some embodiments, the inverters 601, 603, 605, and 607 can be omitted. A set bar signal SB is used to set the output voltage on the output node Q to a logic high voltage when the set bar signal SB is at a logic low level. The passing gate circuit 702, a NMOS transistor according to this embodiment, is coupled between a receiving node 709 and a node 715, has a gate coupled to the inverted low swing clock signal CKB, receives a data signal from the receiving node 709, and passing the data signal from the receiving node 709 to the node 715 when the inverted low swing clock signal CKB is at a logic high level. When the inverted low swing clock signal CKB is at a logic high level, the NMOS transistor 702 is turned on to pass a data signal from the node 709 to the node 715. The latch circuit 704 coupled between the node 715 and a node 716 receives the data signal from the node 715, and can invert the data signal to generate a processed data signal on the node 716 when the set bar signal SB is at a logic high level, and generate a logic high voltage as the processed data signal on the node 716 when the set bar signal SB is at a logic low level. The passing gate circuit 706, a NMOS transistor according to this embodiment, is coupled between the node 716 and a node 725, has a gate coupled to the low swing clock signal CK, and passes the processed data signal from the node 716 to the node 725 when the low swing clock signal CK is at a logic high level. When a low swing clock signal CK is at a logic high level, the NMOS transistor 706 is turned on to pass the processed data signal from the node 716 to the node 725. The latch circuit 708 coupled between the node 725 and a node 726 receives the processed data signal from the node 725, and can invert the processed data signal to generate an output signal on the node 726 when the set bar signal is at the logic high level. When the set bar signal SB is at a logic low level, the latch circuit 704 generates a logic high voltage as the processed data signal on the node 716, and the latch circuit 708 generates a logic low voltage as the output signal on the node 726, and the inverter 703 inverts the logic low voltage on the node 726 to generate a logic high voltage on the output node Q.

The latch circuit 704 has a similar circuit structure as that of a combination of the latch circuit 504 and the input circuit 582 shown in FIG. 5G. A difference between the latch circuit 704 and the combination of the latch circuit 504 and the input circuit 582 is a NAND gate 714. The NAND gate 714 performs an NAND operation on the set bar signal SB and the data signal of the node 715 to generate the processed data signal on the node 716. Thus, when the set bar signal SB is at a logic low level, the latch circuit 704 generates a logic high voltage as the processed data signal on the node 716. Another difference between the latch circuit 704 and the combination of the latch circuit 504 and the input circuit 582 is the NMOS transistor 717 coupled between the node 716 and the drain of the NMOS transistor 718. The gate of the NMOS transistor 717 is coupled to the set bar signal SB. When the set bar signal SB is at a logic low level, the NMOS transistor 717 is turned off to disconnect the data path from the node 719 to the node 716.

The latch circuit 708 has a similar circuit structure as that of a combination of the latch circuit 508 and the input circuit 584 shown in FIG. 5G. The difference between the latch circuit 708 and a combination of the latch circuit 508 and the input circuit 584 is a NOR gate 724. The NOR gate 724 performs a NOR operation on an inverted set bar signal and the processed data signal of the node 725 to generate an output signal on the node 726. Thus, when the set bar signal SB is at a logic high level, the NOR gate 724 acts as an inverter inverting the processed data signal on the node 725 to generate an output signal on the node 726.

When the set bar signal SB is at a logic high level, and when there is a new input signal D coming in, the inverted low swing clock signal CKB can be enabled to be at a logic high level and the low swing clock signal CK can be at a logic low level. Then the NMOS transistor 702 passes the data signal from the node 709 to the node 715 of the latch circuit 704, the NMOS transistor 713 cuts off the feedback path of the latch circuit 704, the NMOS transistor 706 is off, and the NMOS transistor 723 retains/builds the feedback path of the latch circuit 708. Then the latch circuit 704 receives the data signal from the node 715, and inverts the data signal to generate an inverted data signal on the node 716. Since the NMOS transistor 706 is off, instead of receiving inverted data signal corresponding to the new input signal D, the latch circuit 708 would latch an inverted data signal of last stage. Thus the value of an inverted output signal on the output node Q would be substantially equal to the value of last input signal instead of the new input signal D. Next, the inverted low swing clock signal CKB can be changed to be at a logic low level and the low swing clock signal CK can be at a logic high level. Then the NMOS transistor 702 is off, the NMOS transistor 713 retains/builds the feedback path of the latch circuit 704, the NMOS transistor 706 passes the inverted data signal from the node 716 to the node 725 of the latch circuit 708, and the NMOS transistor 723 cuts off the feedback path of the latch circuit 708. The latch circuit 708 then inverts the inverted data signal to generate an output signal on the node 726. The inverter 703 then inverts the output signal on the node 726 to generate an inverted output signal on the output node Q, and the value of inverted output signal on the output node Q now is substantially equal to the value of the new input signal D. When the set bar signal SB is at a logic low level, the latch circuit 708 generates a logic low voltage as the output signal on the node 726, and then the value of the signal on the output node Q is set as logic high.

In some embodiments, the NMOS transistors 712 and 713 of the latch circuit 704 shown in FIG. 7 can be replaced with the NMOS transistors 412' and 413' of the latch circuit 404' shown in FIG. 4. And the NMOS transistors 722 and 723 of the latch circuit 708 shown in FIG. 7 can be replaced with the NMOS transistors 422' and 423' of the latch circuit 408' shown in FIG. 4.

Figure 8:
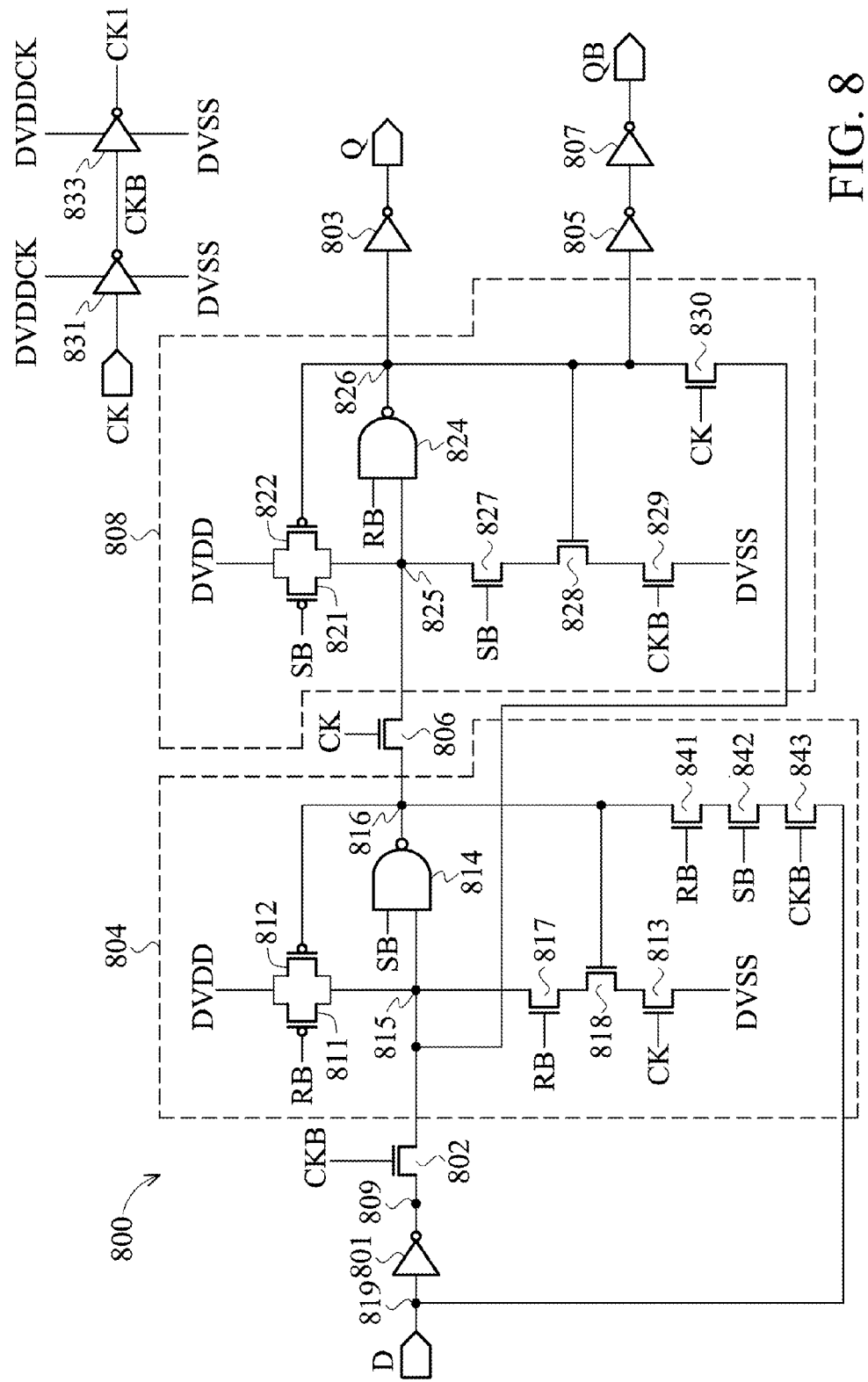
FIG. 8 is a circuit diagram of an embodiment of a flip-flop receiving a reset bar signal and a set bar signal according to the invention.

Referring to FIG. 8, a circuit diagram of an embodiment of a flip-flop 800 receiving a reset bar signal and a set bar signal according to the invention is shown. In one embodiment, the flip-flop 800 comprises inverters 801, 803, 805, and 807, two passing gate circuits 802 and 806, and latch circuits 804 and 808. In some embodiments, the inverters 801, 803, 805, and 807 can be omitted. A reset bar signal RB is used to reset the output voltage on the output node Q to a logic low voltage when the reset bar signal RB is at a logic low level. A set bar signal SB is used to set the output voltage on the output node Q to a logic high voltage when the set bar signal SB is at a logic low level. The passing gate circuit 802, a NMOS transistor according to this embodiment, is coupled between a receiving node 809 and a node 815, has a gate coupled to the inverted low swing clock signal CKB, receives a data signal from the receiving node 809, and passing the data signal from the receiving node 809 to the node 815 when the inverted low swing clock signal CKB is at a logic high level. When an inverted low swing clock signal CKB is at a logic high level, the NMOS transistor 802 is turned on to pass the data signal from the node 809 to the node 815. The latch circuit 804 of the flip-flop 800 has a similar circuit structure and circuit function as those of the latch circuit 704 of the flip-flop 700 shown in FIG. 7. The latch circuit 804 coupled between the node 815 and a node 816 receives the data signal from the node 815, and can invert the data signal to generate a processed data signal on the node 816 when the set bar signal SB is at a logic high level and generate a logic high voltage as the processed data signal on the node 816 when the set bar signal SB is at a logic low level. The passing gate circuit 806, a NMOS transistor according to this embodiment, is coupled between the node 816 and a node 825, has a gate coupled to the low swing clock signal CK, and passes the processed data signal from the node 816 to the node 825 when the low swing clock signal is at a logic high level. When a low swing clock signal CK is at a logic high level, the NMOS transistor 806 is turned on to pass the processed data signal from the node 816 to the node 825. The latch circuit 808 of the flip-flop 800 has a similar circuit structure and circuit function as those of the latch circuit 608 of the flip-flop 600 shown in FIG. 6. The latch circuit 808 coupled between the node 825 and a node 826 receives the processed data signal from the node 825, and can invert the processed data signal to generate an output signal on the node 826 when the reset bar signal RB is at a logic high level and generate a logic high voltage as the output signal on the node 826 when the reset bar signal RB is at a logic low level. When the reset bar signal RB is at a logic low level, the latch circuit 808 generates a logic high voltage as the output signal on the node 826, and the inverter 803 inverts the logic high voltage on the node 826 to generate a logic low voltage on the output node Q. When the set bar signal SB is at a logic low level, the latch circuit 804 generates a logic high voltage as the processed data signal on the node 816, and the latch circuit 808 then inverts the processed data signal to generate a logic low voltage as the output signal on the node 826, and the inverter 803 inverts the logic low voltage on the node 826 to generate a logic high voltage on the output node Q.

The latch circuit 804 has a similar circuit structure to that of the latch circuit 704 shown in FIG. 7. The latch circuit 804 comprises a NAND gate 814 coupled between the nodes 815 and 816. The NAND gate 816 performs an NAND operation on the set bar signal SB and the data signal of the node 815 to generate the processed data signal on the node 816. Thus, when the set bar signal SB is at a logic low level, the latch circuit 804 generates a logic high voltage as the processed data signal on the node 816. The latch circuit 808 has a similar circuit structure to that of the latch circuit 608 shown in FIG. 6. The latch circuit 808 comprises a NAND gate 824. The NAND gate 824 performs an NAND operation on the reset bar signal RB and the processed data signal of the node 825 to generate an output signal on the node 826. Thus, when the reset bar signal RB is at a logic low level, the latch circuit 808 generates a logic high voltage as the output signal on the node 826.

When the set bar signal SB and the reset bar signal RB are at a logic high level, and when there is a new input signal D coming in, the inverted low swing clock signal CKB can be enabled to be at a logic high level and the low swing clock signal CK can be at a logic low level. Then the NMOS transistor 802 passes the data signal from the node 809 to the node 815 of the latch circuit 804, the NMOS transistor 813 cuts off the feedback path of the latch circuit 804, the NMOS transistor 806 is off, and the NMOS transistor 829 retains/builds the feedback path of the latch circuit 808. Then the latch circuit 804 receives the data signal from the node 815, and inverts the data signal to generate an inverted data signal on the node 816. Since the NMOS transistor 806 is off, instead of receiving inverted data signal corresponding to the new input signal D, the latch circuit 808 would latch an inverted data signal of last stage. Thus the value of an inverted output signal on the output node Q would be substantially equal to the value of last input signal instead of the new input signal D. Next, the inverted low swing clock signal CKB can be changed to be at a logic low level and the low swing clock signal CK can be at a logic high level. Then the NMOS transistor 802 is off, the NMOS transistor 813 retains/builds the feedback path of the latch circuit 804, the NMOS transistor 806 passes the inverted data signal from the node 816 to the node 825 of the latch circuit 808, and the NMOS transistor 829 cuts off the feedback path of the latch circuit 808. The latch circuit 808 then inverts the inverted data signal to generate an output signal on the node 826. The inverter 803 then inverts the output signal on the node 826 to generate an inverted output signal on the output node Q, and the value of inverted output signal on the output node Q now is substantially equal to the value of the new input signal D. When the reset bar signal RB is at a logic low level, the latch circuit 808 generates a logic high voltage on the node 826, and then the value of the signal on the output node Q is reset as logic low. When the set bar signal SB is at a logic low level, the reset bar signal RB is at a logic high level and the low swing clock signal CK is at a logic high level, the latch circuit 804 generates a logic high voltage as signal on the node 816, the NMOS transistor 806 passes the signal from the node 816 to the node 825 of the latch circuit 808, the latch circuit 808 then inverts the signal to generate a logic low voltage on the node 826 as the output signal, and then the value of the signal on the output node Q is set as logic high.

In some embodiments, the NMOS transistors 818 and 813 of the latch circuit 804 shown in FIG. 8 can be replaced with the NMOS transistors 412' and 413' of the latch circuit 404' shown in FIG. 4. And the NMOS transistors 828 and 829 of the latch circuit 808 shown in FIG. 8 can be replaced with the NMOS transistors 422' and 423' of the latch circuit 408' shown in FIG. 4.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A flip-flop, powered by a first voltage source and receiving a low swing clock signal inverted according to a second voltage source lower than the first voltage source to obtain an inverted low swing clock signal, comprising:
    a first NMOS transistor, coupled between a receiving node and a first node and having a gate coupled to the inverted low swing clock signal, the first NMOS transistor passing a data signal from the receiving node to the first node when the inverted low swing clock signal is at a logic high level;
    a first latch circuit, coupled between the first node and a second node to receive the data signal and to generate a processed data signal on the second node based on the low swing clock signal, the inverted low swing clock signal and at least one control signal of the flip-flop;
    a second NMOS transistor, coupled between the second node and a third node and having a gate coupled to the low swing clock signal, the second NMOS transistor passing the processed data signal from the second node to the third node when the low swing clock signal is at the logic high level; and
    a second latch circuit, coupled between the third node and a fourth node to receive the processed data signal and to generate an output signal on the fourth node based on the low swing clock signal, the inverted low swing clock signal and at least one control signal of the flip-flop,
wherein the flip-flop is controlled by control signals including a reset bar signal and a set bar signal for resetting and setting the flip-flop.

2. The flip-flop as claimed in claim 1, wherein:
the reset bar signal is inverted to obtain an inverted reset bar signal;
the flip-flop further comprises a first inverter coupled between an input node and the receiving node for receiving an input signal from the input node and inverting the input signal to generate the data signal on the receiving node; and
the first latch circuit comprises:
a NOR gate, coupled between the first node and the second node, performing a NOR operation on the inverted reset bar signal and the data signal to generate the processed data signal on the second node;
a first PMOS transistor, coupled between the first voltage source and the first node, and having a gate coupled to the second node;
a third NMOS transistor, having a drain coupled to the first node, and having a gate coupled to the second node;
a fourth NMOS transistor, coupled between the source of the third NMOS transistor and a ground, and having a gate coupled to the low swing clock signal;
a fifth NMOS transistor, having a drain coupled to the second node, and having a gate coupled to the reset bar signal; and
a sixth NMOS transistor, coupled between the source of the fifth NMOS transistor and the input node, and having a gate coupled to the inverted low swing clock signal.

3. The flip-flop as claimed in claim 1, wherein the second latch circuit comprises:
a NAND gate, coupled between the third node and the fourth node, performing a NAND operation on the reset bar signal and the processed data signal to generate the output signal on the fourth node;
a second PMOS transistor, coupled between the first voltage source and the third node, and having a gate coupled to the fourth node;
a seventh NMOS transistor, having a drain coupled to the third node, and having a gate coupled to the fourth node;
an eighth NMOS transistor, coupled between the source of the seventh NMOS transistor and a ground, and having a gate coupled to the inverted low swing clock signal; and
a ninth NMOS transistor, coupled between the fourth node and the first node, and having a gate coupled to the low swing clock signal.

4. The flip-flop as claimed in claim 1, wherein:
the flip-flop further comprises a first inverter coupled between an input node and the receiving node for receiving an input signal from the input node and inverting the input signal to generate the data signal on the receiving node; and
the first latch circuit comprises:
a NAND gate, coupled between the first node and the second node, performing a NAND operation on the set bar signal and the data signal to generate the processed data signal on the second node;
a first PMOS transistor, coupled between the first voltage source and the first node, and having a gate coupled to the second node;
a third NMOS transistor, having a drain coupled to the first node, and having a gate coupled to the second node;
a fourth NMOS transistor, coupled between the source of the third NMOS transistor and a ground, and having a gate coupled to the low swing clock signal;

a fifth NMOS transistor, having a drain coupled to the second node, and having a gate coupled to the set bar signal; and a sixth NMOS transistor, coupled between the source of the fifth NMOS transistor and the input node, and having a gate coupled to the inverted low swing clock signal.

5. The flip-flop as claimed in claim 1, wherein:

the set bar signal is inverted to obtain an inverted set bar signal; and the second latch circuit comprises:

a NOR gate, coupled between the third node and the fourth node, performing a NOR operation on the inverted set bar signal and the processed data signal to generate the output signal on the fourth node;

a second PMOS transistor, coupled between the first voltage source and the third node, and having a gate coupled to the fourth node;

a seventh NMOS transistor, having a drain coupled to the third node, and having a gate coupled to the fourth node;

an eighth NMOS transistor, coupled between the source of the seventh NMOS transistor and a ground, and having a gate coupled to the inverted low swing clock signal; and a ninth NMOS transistor, coupled between the fourth node and the first node, and having a gate coupled to the low swing clock signal.

6. The flip-flop as claimed in claim 1, wherein:

the flip-flop further comprises a first inverter coupled between an input node and the receiving node for receiving an input signal from the input node and inverting the input signal to generate the data signal on the receiving node; and the first latch circuit comprises:

a NAND gate, coupled between the first node and the second node, performing a NAND operation on the set bar signal and the data signal to generate the processed data signal on the second node;

a first PMOS transistor, coupled between the first voltage source and the first node, and having a gate coupled to the reset bar signal;

a second PMOS transistor, coupled between the first voltage source and the first node, and having a gate coupled to the second node;

a third NMOS transistor, having a drain coupled to the first node, and having a gate coupled to the reset bar signal;

a fourth NMOS transistor, having a drain coupled to the source of the third NMOS transistor, and having a gate coupled to the second node;

a fifth NMOS transistor, coupled between the source of the fourth NMOS transistor and a ground, and having a gate coupled to the low swing clock signal;

a sixth NMOS transistor, having a drain coupled to the second node, and having a gate coupled to the reset bar signal;

a seventh NMOS transistor, having a drain coupled to the source of the sixth NMOS transistor, and having a gate coupled to the set bar signal; and an eighth NMOS transistor, coupled between the source of the seventh NMOS transistor and the input node, and having a gate coupled to the inverted low swing clock signal.

7. The flip-flop as claimed in claim 1, wherein the second latch circuit comprises:

a NAND gate, coupled between the third node and the fourth node, performing a NAND operation on the reset bar signal and the processed data signal to generate the output signal on the fourth node;

a third PMOS transistor, coupled between the first voltage source and the third node, and having a gate coupled to the set bar signal;

a fourth PMOS transistor, coupled between the first voltage source and the third node, and having a gate coupled to the fourth node;

a ninth NMOS transistor, having a drain coupled to the third node, and having a gate coupled to the set bar signal;

a tenth NMOS transistor, having a drain coupled to the source of the ninth NMOS transistor, and having a gate coupled to the fourth node;

an eleventh NMOS transistor, coupled between the source of the tenth NMOS transistor and a ground, and having a gate coupled to the inverted low swing clock signal; and a twelfth NMOS transistor, coupled between the fourth node and the first node, and having a gate coupled to the low swing clock signal.

8. The flip-flop as claimed in claim 1, wherein the flip-flop further comprises:

a first inverter, coupled between an input node and the receiving node, receiving an input signal from the input node and inverting the input signal to generate the data signal on the receiving node;

a second inverter, coupled between the fourth node and an output node, inverting the output signal on the fourth node to generate an inverted output signal on the output node; and a third inverter and a fourth inverter, coupled in series between the fourth node and an inverted output node, delivering the output signal on the fourth node to the inverted output node.

* * * * *